(12) United States Patent
Kamatani et al.

(10) Patent No.: US 9,846,385 B2
(45) Date of Patent: Dec. 19, 2017

(54) ORGANIC LIGHT EMITTING ELEMENT AND DISPLAY DEVICE

(71) Applicant: CANON KABUSHIKI KAISHA, Tokyo (JP)

(72) Inventors: Jun Kamatani, Tokyo (JP); Tetsuya Kosuge, Yokohama (JP); Masumi Itabashi, Kodaira (JP); Yosuke Nishide, Kawasaki (JP); Hirokazu Miyashita, Tokyo (JP); Naoki Yamada, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 484 days.

(21) Appl. No.: 14/561,020

(22) Filed: Dec. 4, 2014

(65) Prior Publication Data

US 2015/0162549 A1 Jun. 11, 2015

(30) Foreign Application Priority Data

Dec. 6, 2013 (JP) .................................. 2013-253637

(51) Int. Cl.
*H01L 29/08* (2006.01)
*H01L 51/00* (2006.01)
(Continued)

(52) U.S. Cl.
CPC ..... *G03G 15/04054* (2013.01); *H01L 51/006* (2013.01); *H01L 51/0059* (2013.01);
(Continued)

(58) Field of Classification Search
CPC ........ G03G 15/04054; H01L 2251/308; H01L 27/3244; H01L 51/0058; H01L 51/0059;
(Continued)

(56) References Cited

U.S. PATENT DOCUMENTS

2002/0055015 A1 5/2002 Sato

FOREIGN PATENT DOCUMENTS

JP 2003068468 A 3/2003

OTHER PUBLICATIONS

Journal of Molecular Catalysis A: Chemical, (2005), 241 (1-2), pp. 88-92.*

(Continued)

*Primary Examiner* — Dawn Garrett
(74) *Attorney, Agent, or Firm* — Canon U.S.A. Inc., IP Division

(57) ABSTRACT

An organic light emitting element contains an anode and a cathode, and a light emitting layer arranged between the anode and the cathode, and the organic light emitting element further contains an organic compound layer which is arranged between the cathode and the light emitting layer, and touches the cathode. The organic compound layer contains an organic compound represented by the following general formula [1], where $R_1$ to $R_4$ represent substituents.

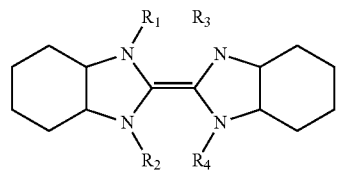

[1]

19 Claims, 4 Drawing Sheets

(51) Int. Cl.
*G03G 15/04* (2006.01)
*H01L 51/50* (2006.01)
*H01L 27/32* (2006.01)

(52) U.S. Cl.
CPC ...... *H01L 27/3244* (2013.01); *H01L 51/0058* (2013.01); *H01L 51/0085* (2013.01); *H01L 51/504* (2013.01); *H01L 51/5036* (2013.01); *H01L 51/5092* (2013.01); *H01L 2251/308* (2013.01)

(58) Field of Classification Search
CPC ............... H01L 51/006; H01L 51/0085; H01L 51/5036; H01L 51/504; H01L 51/5092
See application file for complete search history.

(56) References Cited

OTHER PUBLICATIONS

Coleman, et al; Journal of Organometallic Chemistry, 250 (1983) C9-C14; Elsevier Sequoia S.A., Lausanne, Printed in the Netherlands.

\* cited by examiner

ORGANIC LIGHT EMITTING ELEMENT AND DISPLAY DEVICE

BACKGROUND OF THE INVENTION

Field of the Invention

The present invention relates to an organic light emitting element containing a 1,1',3,3a,3',3'a,4,4',5,5',6,6',7,7a,7',7'a-hexadecahydro-2,2'-bibenzo[d]imidazolidene compound and a display device.

Description of the Related Art

An organic light emitting element is an element containing an anode and a cathode, and an organic compound layer arranged between both electrodes. In the organic light emitting element, excitons are generated by recombination of holes and electrons injected from the above each electrode in a light emitting layer, which is an organic compound layer, and light is released when the excitons return to the ground state.

With the recent significant advances in organic light emitting elements, it is possible to make a slim lightweight light emitting device which has low driving voltage, diverse light emission wavelengths and high responsivity.

In an organic light emitting element, improvements in electron injection properties are important to migrate toward lower voltages in the element. As a technique to improve electron injection properties, doping metals in electron injection layers is described in Japanese Patent Application Laid-Open No. 2003-68468 and US 2002/0055015 A.

In addition, the synthesis method of a compound like 1-A is known in COLEMAN. A W. Journal of Organometallic Chemistry (1983), 250(1), C9-C14; however, there are no cases in which the compound is used for an organic light emitting element. In addition, there are cases in which a methyl group and a benzyl group are substituted on the nitrogen atoms; however, there are no cases in which an aromatic substituent such as an aryl group is substituted thereon.

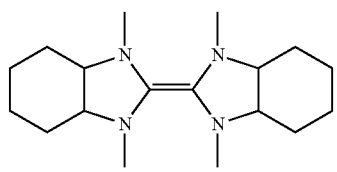

1-A

The electron injection layers described in Japanese Patent Application Laid-Open No. 2003-68468 and US 2002/0055015 A have metals. This is advantageous in terms of electron injection properties; however, when these metals are used for an electron injection layer, a stable organic light emitting element cannot be obtained. This is because the metals used for an electron injection layer have high reactivity to moisture.

SUMMARY OF THE INVENTION

An object of the present invention is to provide an organic light emitting element with high stability by containing a stable electron injection layer with excellent water resistance.

Therefore, aspects of the present invention provide an organic light emitting element containing an anode and a cathode, and a light emitting layer arranged between the anode and the cathode. The organic light emitting element further contains an organic compound layer which is arranged between the cathode and the light emitting layer and touches the cathode. The organic compound layer contains a 1,1',3,3a,3',3'a,4,4',5,5',6,6',7,7a,7',7'a-hexadecahydro-2,2'-bibenzo[d]imidazolidene compound represented by the following general formula [1].

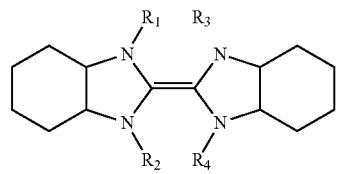

[1]

In the formula [1], $R_1$ to $R_4$ are each independently selected from a substituted or unsubstituted phenyl group, a substituted or unsubstituted biphenyl group, a substituted or unsubstituted naphthyl group, a substituted or unsubstituted phenanthrene group, a substituted or unsubstituted fluorenyl group, a substituted or unsubstituted triphenylene group, a substituted or unsubstituted dibenzofuran group, and a substituted or unsubstituted dibenzothiophene group.

Further features of the present invention will become apparent from the following description of exemplary embodiments (with reference to the attached drawings).

DESCRIPTION OF THE EMBODIMENTS

Figure 1:
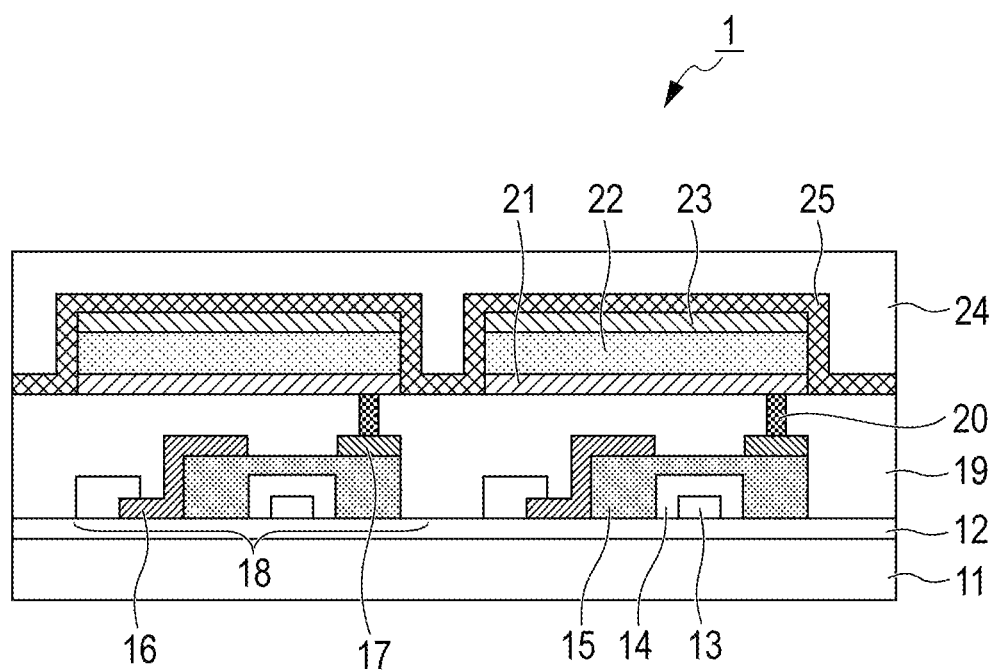
FIG. 1 is a cross-sectional schematic diagram showing an organic light emitting element and a switching element connected to the organic light emitting element.

The light emitting element according to the present invention is an organic light emitting element containing an anode and a cathode, and a light emitting layer which is arranged between the anode and the cathode, and the organic light emitting element further containing an organic compound layer which is arranged between the cathode and the light emitting layer and touches the cathode, wherein the organic compound layer contains a 1,1',3,3a,3',3'a,4,4',5,5',6,6',7,7a,7',7'a-hexadecahydro-2,2'-bibenzo[d]imidazolidene compound.

In the present embodiment, a 1,1',3,3a,3',3'a,4,4',5,5',6,6',7,7a,7',7'a-hexadecahydro-2,2'-bibenzo[d]imidazolidene compound can be referred to as the organic compound according to the present embodiment and the organic compound represented by the general formula [1].

The organic light emitting element according to the present invention contains an organic compound layer which is arranged between the cathode and the light emitting layer and touches the cathode. This organic compound layer can be also referred to as an electron injection layer.

The electron injection layer of the organic light emitting element according to the present invention contains an organic compound represented by the following general formula [1].

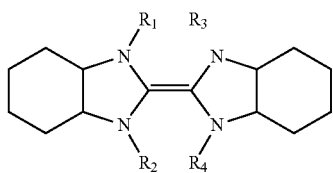

[1]

In the formula [1], $R_1$ to $R_4$ are substituents each independently selected from a substituted or unsubstituted phenyl group, a substituted or unsubstituted biphenyl group, a substituted or unsubstituted naphthyl group, a substituted or unsubstituted phenanthrene group, a substituted or unsubstituted fluorenyl group, a substituted or unsubstituted triphenylene group, a substituted or unsubstituted dibenzofuran group, and a substituted or unsubstituted dibenzothiophene group.

In the present embodiment, substituted or unsubstituted indicates that a substituent may be contained or may not be contained. Containing a substituent indicates that a hydrogen atom which the organic compound contains is substituted with a substituent such as a phenyl group.

The above-mentioned phenyl group, biphenyl group, naphthyl group, phenanthrenyl group, fluorenyl group, triphenylenyl group, dibenzofuranyl group, and dibenzothiophene group may contain substituents.

The substituents which the above-mentioned substituents may contain are an alkyl group, a hydrocarbon aromatic ring group, a heteroaromatic ring group, an alkoxy group, an aryloxy group, and a halogen atom.

The alkyl group according to the present embodiment is an alkyl group having 1 or more and 4 or less carbon atoms. Specific examples thereof include a methyl group, an ethyl group, an n-propyl group, an iso-propyl group, an n-butyl group, an iso-butyl group, a sec-butyl group, a tert-butyl group.

Examples of the hydrocarbon aromatic ring group according to the present embodiment include a phenyl group, a naphthyl group, a phenanthryl group, a fluorenyl group.

Examples of the heteroaromatic ring group according to the present embodiment include a thienyl group, a dibenzofuran group, a dibenzothiophene group, a pyrrolyl group, a pyridyl group.

Examples of the alkoxy group according to the present embodiment include a methoxy group, an ethoxy group.

Examples of the aryloxy group according to the present embodiment include a phenoxy group, a naphthoxy group.

Examples of the halogen atom according to the present embodiment include fluorine, chlorine, bromine, iodine.

On Properties of the 1,1',3,3a,3',3'a,4,4',5,5',6,6',7,7a,7',7'a-hexadecahydro-2,2'-bibenzo[d]imidazolidene Compound According to the Present Invention The organic compound according to the present embodiment absorbs short wavelengths, 450 nm or less, and hardly absorbs the light emission wavelength of an organic light emitting element. Therefore, when the organic compound is used as an electron injection layer, the inhibition of light emission of light emitting materials can be reduced, which is caused by absorption of the electron injection layer.

Among bis-imidazolidene compounds, the organic compound according to the present embodiment has SP3 carbons at positions 4, 4', 5 and 5' as shown in the following structural formula (2).

On the other hand, a compound which has carbons at positions 4, 4', 5 and 5' and is represented by the following structural formula (3) has an absorption band in the visible region, 600 nm or more. This becomes a factor to cause efficiency reduction of an organic light emitting element, which is not preferred. From this point, the 1,1',3,3a,3',3'a,4,4',5,5',6,6',7,7a,7',7'a-hexadecahydro-2,2'-bibenzo[d]imidazolidene compound of the present invention is suitable for an organic light emitting element.

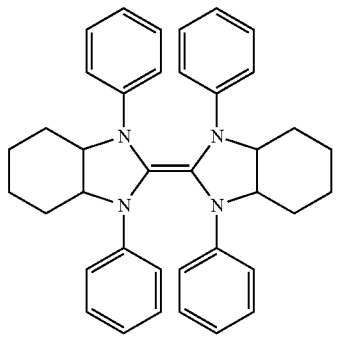

(2)

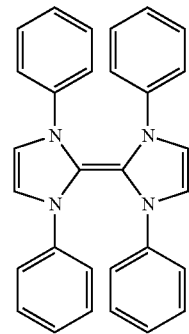

(3)

In addition, it is preferred that the substituents which are substituted on nitrogen atoms be substituents which sterically protect the surroundings of nitrogen, for example, an aromatic ring group. This is important to protect the surroundings of nitrogen atoms, which have high charge density, from other molecules such as water. The compound having a substituent like an alkyl group becomes unstable to water, which decreases the stability of electron injection materials.

In order to examine the stability to water, powders of lithium fluoride and cesium fluoride used as electron injection materials, and bis-imidazolidene derivative compounds were left under high humidity, 95%, for an hour. The results after comparison are shown in Table 1.

TABLE 1

| | | DELIQUESCENCE |
|---|---|---|
| COMPOUND USED IN PRESENT INVENTION | [structure: 1,1',3,3a,3',3'a,4,4',5,5',6,6',7,7a,7',7'a-hexadecahydro-2,2'-bibenzo[d]imidazolidene compound with four N-phenyl substituents] | NO CHANGES |
| COMPARATIVE COMPOUND 1 | LiF | SLIGHTLY DELIQUESCED |
| COMPARATIVE COMPOUND 2 | CsF | DELIQUESCED |
| COMPARATIVE COMPOUND 3 | [structure: bis-imidazolidene with isopropyl groups on nitrogen atoms] | DELIQUESCED |
| COMPARATIVE COMPOUND 4 | [structure: bis-benzimidazolidene with methyl groups on nitrogen atoms] | DELIQUESCED |

Consequently, the alkali metal salts and the bis-imidazolidene compounds in which substituents on nitrogen atoms have alkyl groups deliquesced, while the compound of the present invention did not change. By using such material, a stable organic light emitting element can be obtained.

In the compound represented by (2) as an example of the organic compound according to the present embodiment, the oxidation potential was measured. The compound represented by (2) had a low oxidation potential value, −0.76 V. Due to having such a low oxidation potential, it can be said that the compound is a material with high donor properties.

By mixing this material with a material with high acceptor properties, a charge-transfer complex can be formed. By using this charge-transfer complex for an electrode interface layer of an organic light emitting element, a metal can be easily injected from an electrode. Herein, a material with high acceptor properties is a compound with higher oxidation potential than that of the organic compound according to the present embodiment.

In the present embodiment, low oxidation potential indicates that the absolute value of oxidation potential is low.

Therefore, it was found that by containing a 1,1',3,3a,3',3'a,4,4',5,5',6,6',7,7a,7',7'a-hexadecahydro-2,2'-bibenzo[d]imidazolidene compound with low oxidation potential in an electron injection layer, the organic light emitting element according to the present invention has excellent water resistance as compared to when using alkali metal salts and alkali metals which have been used until now. By containing this in the electron injection layer of an organic light emitting element, a long-life stable organic light emitting element can be provided.

On Properties of the Organic Light Emitting Element Using the 1,1',3,3a,3',3'a,4,4',5,5',6,6',7,7a,7',7'a-hexadecahydro-2,2'-bibenzo[d]imidazolidene Compound According to the Present Invention The organic compound according to the present embodiment is mainly used for at least one layer of an electron injection layer, an electron transport layer, a hole transport layer, and a hole injection layer in an organic light emitting element.

A hole blocking layer is used as a meaning of a layer to block holes, but in the present embodiment, a layer adjoining to the cathode side of a light emitting layer is referred to as a hole blocking layer.

At this time, the light emitting layer may be constituted of a plurality of components, and the components can be divided into the main component and the minor component. The main component is a compound with a maximum weight ratio among all compounds constituting a light emitting layer, and can be referred to as a host material.

The minor components are compounds other than the main component. The minor components can be referred to as a guest (dopant) material, an emitting assist material and a charge injection material. The emitting assist material and the charge injection material may be organic compounds which have the same structure or organic compounds which have different structures.

These are minor components, but can be also referred to as host materials 2 in the sense of distinguishing from a guest material.

Herein, the guest material is a compound responsible for main light emission in a light emitting layer. Contrarily, the host material is a compound existing as a matrix around the guest material in a light emitting layer, and is a compound mainly responsible for carrier transport and donation of excitation energy to the guest material.

The concentration of guest material is 0.01 wt % or more and 50 wt % or less, and preferably 0.1 wt % or more and 20 wt % or less based on the whole amount of constituent materials for a light emitting layer. More preferably, it is desired that the concentration of guest material be 10 wt % or less to prevent concentration quenching.

In the layer including a host material, a guest material may be entirely uniformly contained, or may be contained with a concentration gradient, or the guest material may be contained in a specific region to provide a host material layer region without the guest material.

The organic compound according to the present embodiment is mainly used for at least one layer of an electron injection layer, an electron transport layer, a hole transport layer, and a hole injection layer in an organic light emitting element.

When used for an electron injection layer, the organic compound according to the present embodiment can be used by mixing with a second compound. When the sum total of the weight of the organic compound according to the present embodiment and the weight of the second compound is 100 wt %, the weight of the second compound is preferably 0.1 wt % or more and 80 wt % or less, and more preferably 50 wt %. That is, it is preferred that the mixing ratio be 50:50.

Exemplification of the 1,1',3,3a,3',3'a,4,4',5,5',6,6',7,7a,7',7'a-hexadecahydro-2,2'-bibenzo[d]imidazolidene Compound According to the Present Invention Specific structural formulae of the 1,1',3,3a,3',3'a,4,4',5,5',6,6',7,7a,7',7'a-hexadecahydro-2,2'-bibenzo[d]imidazolidene compound according to the present invention will now be exemplified.

The present invention is not limited to these exemplified compounds.

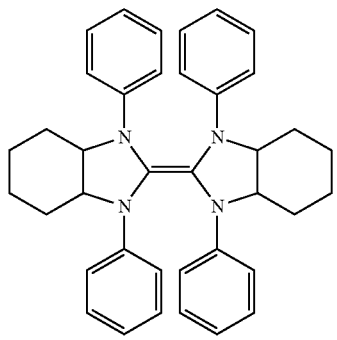

A1

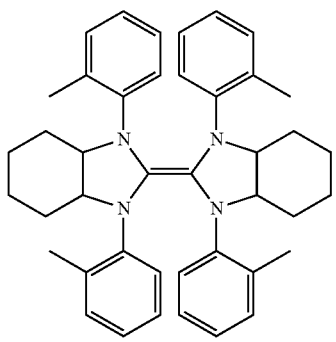

A2

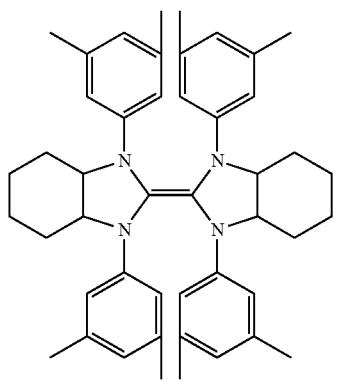

A3

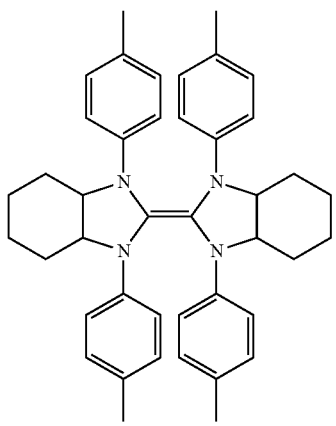

A4

-continued
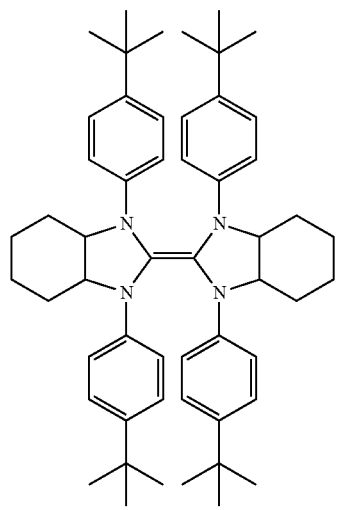
A5
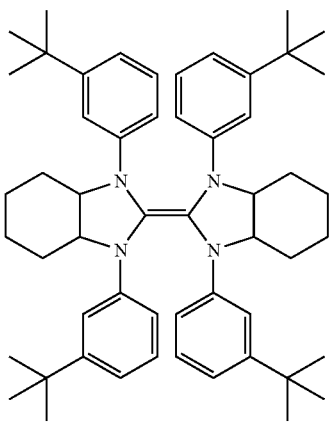
A6
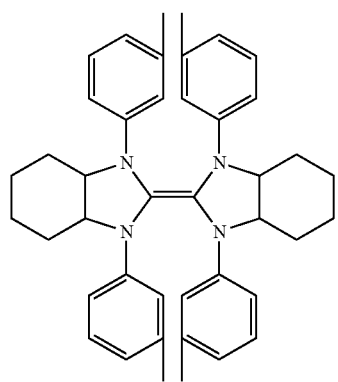
A7
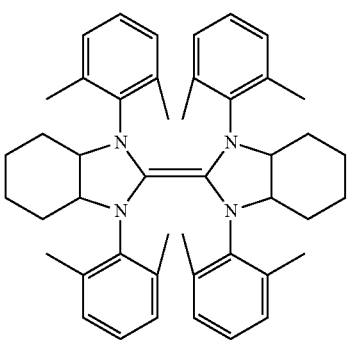
A8
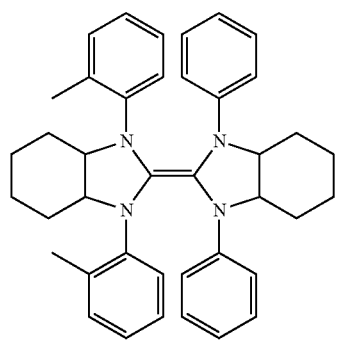
A9
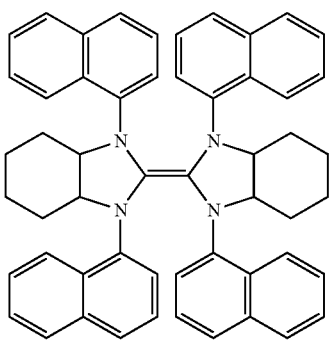
A10

-continued
A11
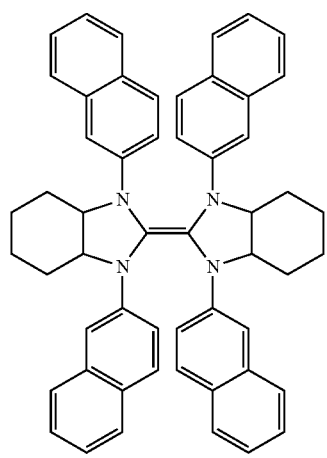
A12
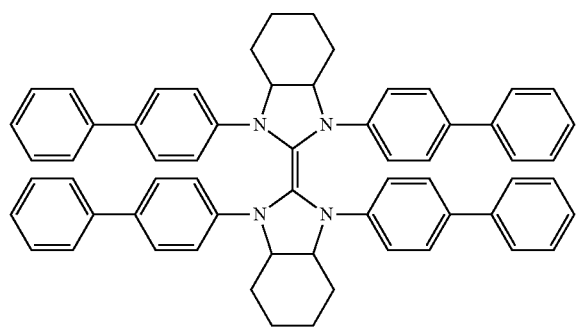
A13
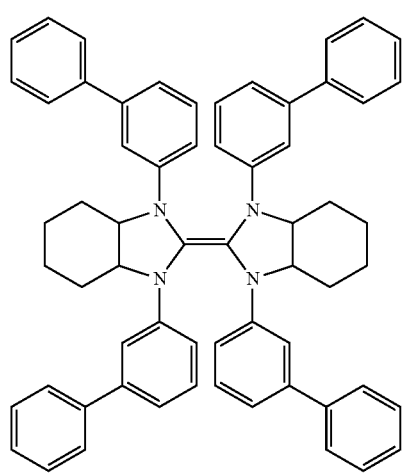
A14
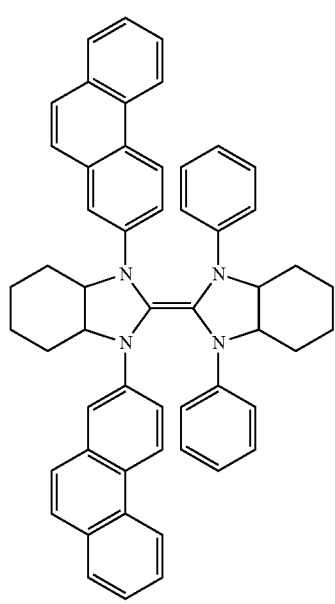
A15
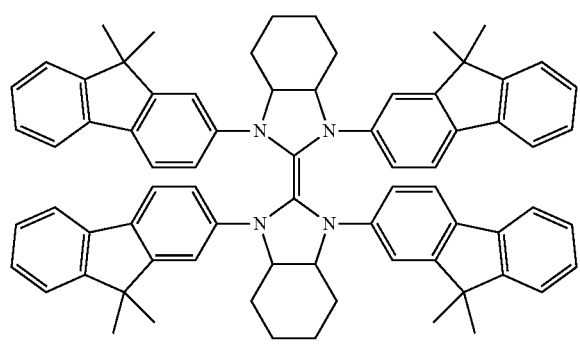
A16
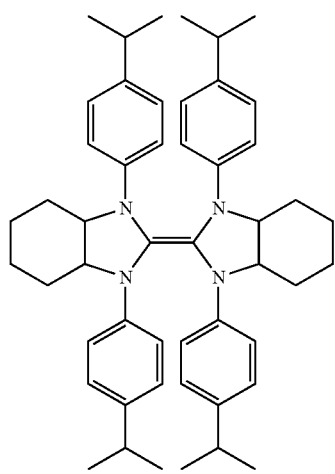

-continued

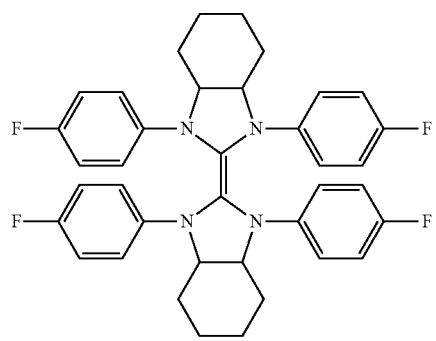
B1

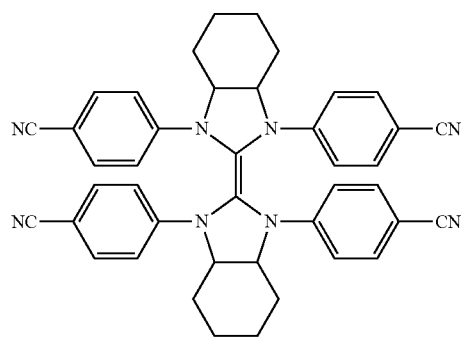
B2

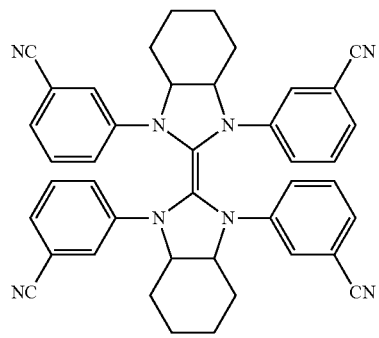
B3

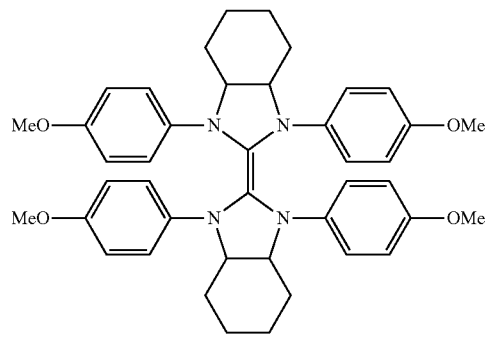
B4

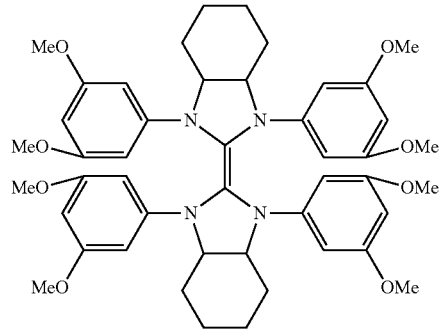
B5

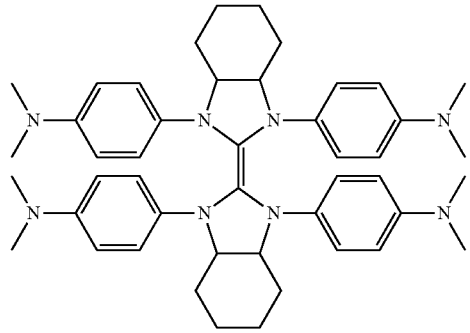
B6

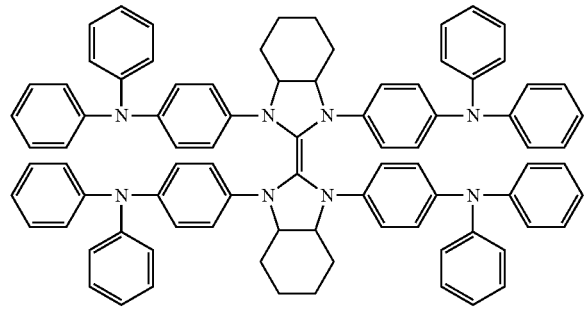
B7

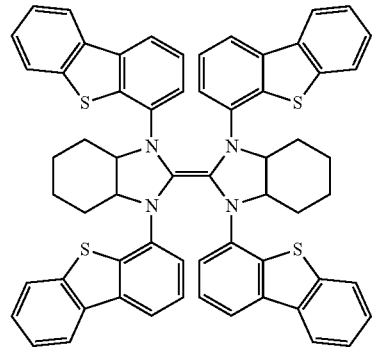
B8

Among exemplified compounds, the compounds shown in the substituent A group contain a hydrocarbon aromatic group or an alkyl group as a substituent. This controls crystallinity and sublimability while maintaining a state in which the oxidation potential of the 1,1',3,3a,3',3'a,4,4',5,5',6,6',7,7a,7',7'a-hexadecahydro-2,2'-bibenzo[d]imidazolidene skeleton is low. Thus, a stable material can be obtained.

Among exemplified compounds, the compounds shown in the B group contain an aromatic substituent containing a heterocycle or a substituent having a hetero group as a substituent. This is a substituent to be provided to adjust the oxidation potential of the 1,1',3,3a,3',3'a,4,4',5,5',6,6',7,7a,7',7'a-hexadecahydro-2,2'-bibenzo[d]imidazolidene skeleton. Thus, a material having a level suitable for an element can be obtained.

Synthesis Method of the bis-imidazolidene Compound According to the Present Embodiment The 1,1',3,3a,3',3'a,4,4',5,5',6,6',7,7a,7',7'a-hexadecahydro-2,2'-bibenzo[d]imidazolidene compound used for the organic light emitting element according to the present invention was synthesized with reference to Organic Syntheses, Coll. Vol. 5, p. 115 (1973); Vol. 47, p. 14 (1967). Diamines, which are raw materials, were synthesized with reference to Philipp Wucher, Philipp Roesle, Laura Falivene, Luigi Cavallo, Lucia Caporaso, Inigo Gottker-Schnetmann, Stefan Mecking, Organometallics, 2012, 31(24), pp 8505-8515. By changing reagents in the reaction process, 1,1',3,3a,3',3'a,4,4',5,5',6,6',7,7a,7',7'a-hexadecahydro-2,2'-bibenzo[d]imidazolidene compounds having a variety of substituents were synthesized.

On the Organic Light Emitting Element According to the Present Invention

Next, the organic light emitting element of the present embodiment will be described.

The organic light emitting element according to the present invention is a light emitting element containing at least an anode and a cathode, which are a pair of electrodes facing each other, and a light emitting layer arranged between them. The organic light emitting element according to the present invention further contains an organic compound layer which touches the cathode and is arranged between the cathode and the light emitting layer. This organic compound layer contains an organic compound represented by the general formula [1].

As the element constitution of the organic light emitting element according to the present invention, multilayered element constitution in which organic compound layers given below are sequentially laminated on a substrate is mentioned. It is noted that among the above organic compound layers, a layer containing a light emitting material is a light emitting layer.

(1) anode/light emitting layer/cathode
(2) anode/hole transport layer/light emitting layer/electron transport layer/cathode
(3) anode/hole transport layer/light emitting layer/electron transport layer/electron injection layer/cathode
(4) anode/hole injection layer/hole transport layer/light emitting layer/electron transport layer/cathode
(5) anode/hole injection layer/hole transport layer/light emitting layer/electron transport layer/electron injection layer/cathode
(6) anode/hole transport layer/electron blocking layer/light emitting layer/hole blocking layer/electron transport layer/cathode These examples of element constitution are, however, strictly basic element constitution, and the constitution of organic light emitting elements using the compound according to the present invention is not limited thereto.

Diverse layer constitution can be created, for example, an insulating layer is provided in the interface between an electrode and an organic compound layer, an adhesive layer or an interference layer is provided, an electron transport layer or a hole transport layer is constituted of two layers with different ionization potentials, a light emitting layer is constituted of two layers with different light emitting materials, and the like.

The element form in this case can be a form in which light is produced from an electrode on the substrate side, i.e. a bottom emission system, and a form in which light is produced from the opposite side of a substrate, i.e. a top emission system, and constitution in which light is produced from the both sides can be also used.

In addition, among the above-mentioned element constitution, the constitution (6) containing both an electron blocking layer and a hole blocking layer is preferably used. In the constitution (6), both carriers, holes and electrons, can be blocked in a light emitting layer, and thus an organic light emitting element with high light emission efficiency without carrier leakage can be obtained.

Herein, when organic compound layers including a light emitting layer arranged between a pair of electrodes are a laminate including a plurality of layers, the organic compound layers can contain a hole injection layer, a hole transport layer, an electron blocking layer, a hole/exciton blocking layer, an electron transport layer, an electron injection layer and the like in addition to the light emitting layer. In addition, the light emitting layer may be a monolayer or a laminate including a plurality of layers.

In the organic light emitting element according to the present embodiment, an organic compound represented by the general formula [1] is contained in an organic compound layer touching the cathode; however, an organic compound represented by the general formula [1] may be used for other organic compound layers.

Specifically, the organic compound according to the present embodiment is contained in any of the above-described hole injection layer, hole transport layer, electron blocking layer, hole/exciton blocking layer, electron transport layer, electron injection layer and the like. The organic compound according to the present embodiment is preferably contained in the electron injection layer.

The light emitting layer which the organic light emitting element according to the present embodiment contains may be a monolayer or the multilayer form, and can contain two or more light emitting materials. The multilayer form means a state in which one light emitting layer and another light emitting layer are laminated. In this case, the emission color of an organic light emitting element is from blue to green and red, but not particularly limited thereto.

More specifically, the emission color may be a white color or a neutral color. In the case of the white color, red, blue and green are emitted depending on light emitting layers. In addition, a film is formed by a film forming method such as deposition or coating film formation.

In the organic light emitting element according to the present invention, an organic compound layer contains a light emitting unit, and this light emitting unit can contain a plurality of light emitting materials. Among the plurality of light emitting materials, at least one light emitting material is a light emitting material emitting light which is different from that of other light emitting materials, and an element containing these materials may be an element emitting a white color.

The organic light emitting element according to the present invention contains a plurality of light emitting layers, and at least any of the plurality of light emitting layers may be a light emitting layer emitting color light different from that of other light emitting layers. The light emitting layer emitting different color light can be referred to as a second light emitting layer.

An organic light emitting element emitting a white color by mixing the light emitted by the plurality of light emitting layers may be formed.

The plurality of light emitting layers may be laminated in the direction from the anode to the cathode or may be arranged horizontally. Being arranged horizontally means that each light emitting layer is arranged to touch an organic compound layer adjoining to the light emitting layer.

In the organic light emitting element according to the present invention, conventionally known low molecular and high molecular light emitting materials, hole injection compounds or hole transport compounds, host compounds, light emitting compounds, electron injection compounds or electron transport compounds and the like can be used together as needed.

Examples of these compounds will be now mentioned.

As the hole injection/transport materials, a material with high hole mobility is preferred so that holes can be easily injected from an anode and injected holes can be transported to a light emitting layer. In addition, in order to prevent film deterioration such as crystallization in an organic light emitting element, a material with high glass transition temperature is preferred.

As the low molecular and high molecular materials with hole injection/transport properties, triarylamine derivatives, arylcarbazole derivatives, phenylenediamine derivatives, stilbene derivatives, phthalocyanine derivatives, porphyrin derivatives, poly(vinylcarbazole), poly(thiophene), other conductive polymers are mentioned. Further, the above-mentioned hole injection/transport materials are also suitably used for an electron blocking layer.

Specific examples of compounds used as hole injection/transport materials will be now mentioned, but certainly not limited thereto.

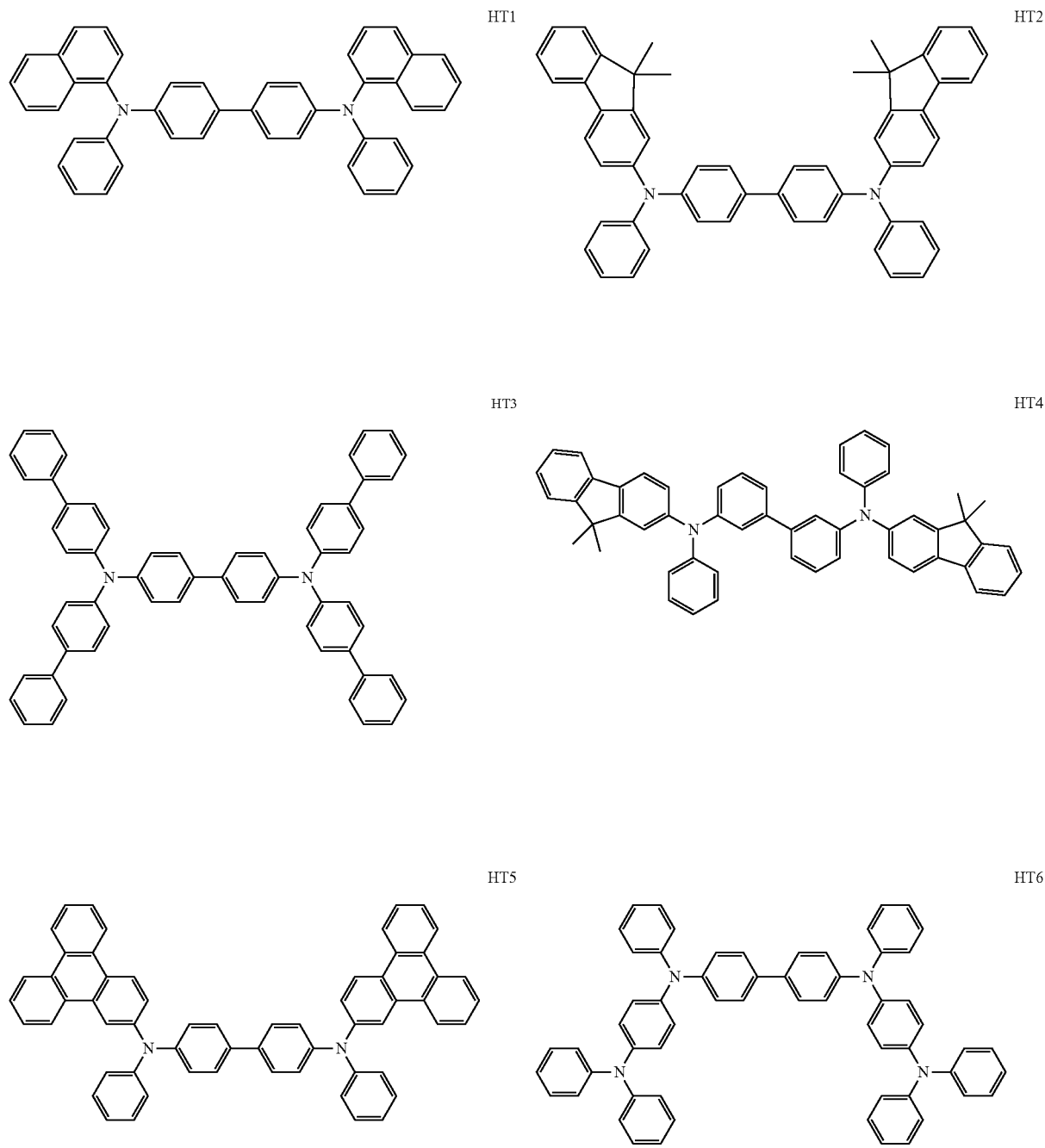

-continued
HT7
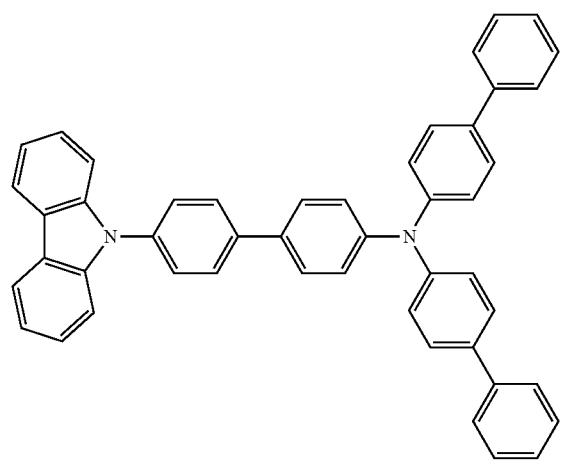
HT8
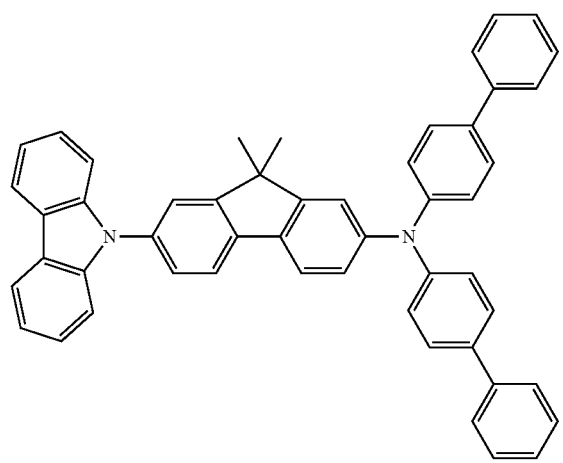
HT9
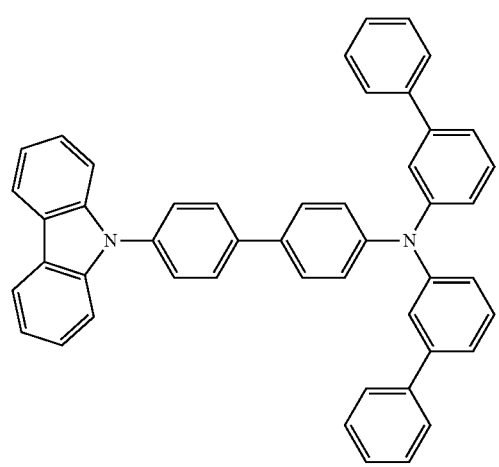
HT10
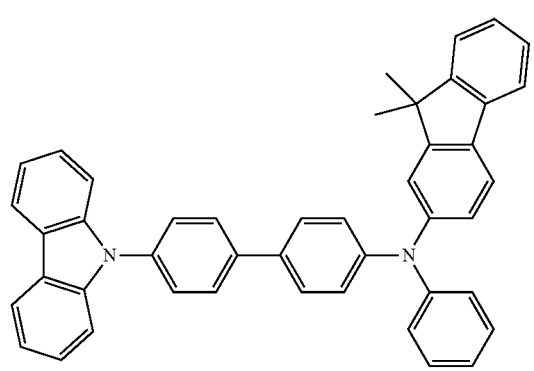
HT11
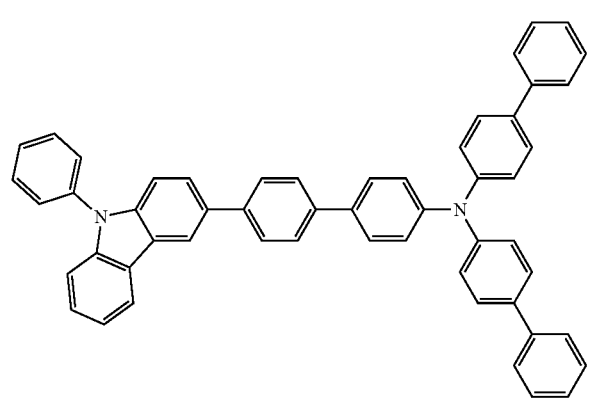
HT12
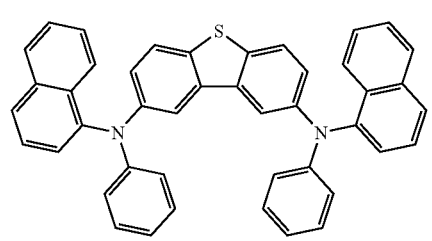

-continued

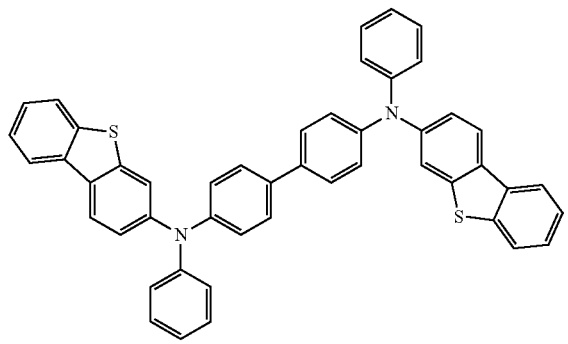
HT13

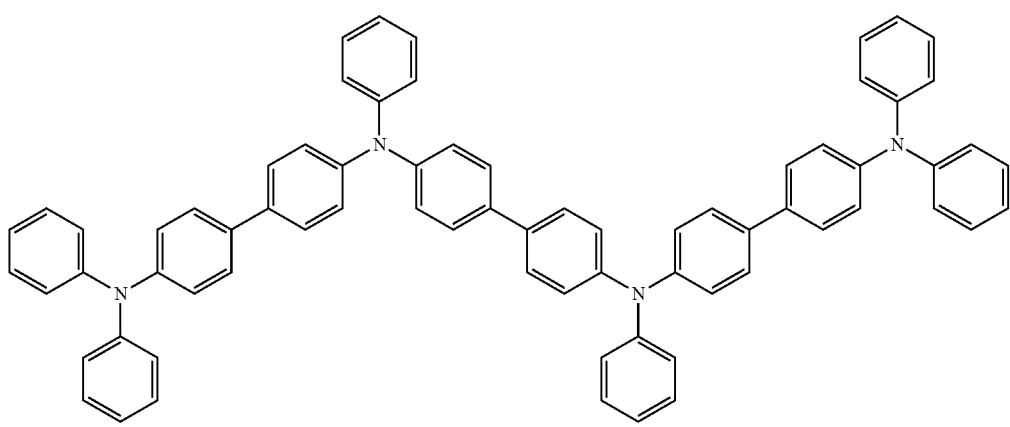
HT14

As the light emitting materials mainly according to light emitting function, fused ring compounds (e.g. fluorene derivatives, naphthalene derivatives, pyrene derivatives, perylene derivatives, tetracene derivatives, anthracene derivatives, rubrene etc.), quinacridone derivatives, coumarin derivatives, stilbene derivatives, organic aluminum complexes such as tris(8-quinolinolate)aluminum, iridium complexes, platinum complexes, rhenium complexes, copper complexes, europium complexes, ruthenium complexes, and polymer derivatives such as poly(phenylenevinylene) derivatives, poly(fluorene) derivatives and poly(phenylene) derivatives are mentioned.

Specific examples of compounds used as light emitting materials will be now mentioned, but certainly not limited thereto.

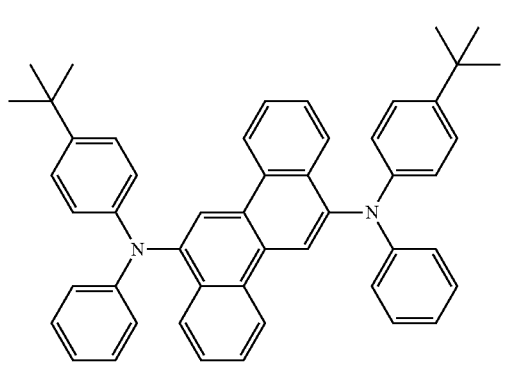
BD1

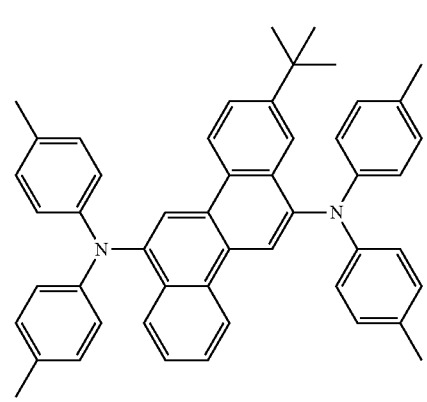
BD2

-continued
BD3
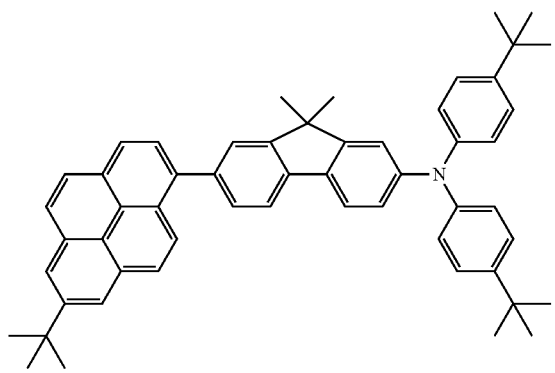
BD4
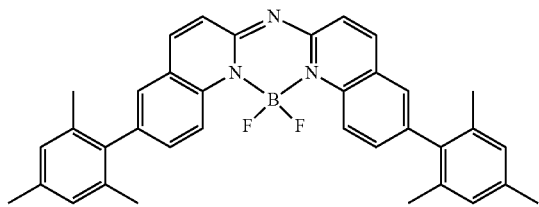
BD5
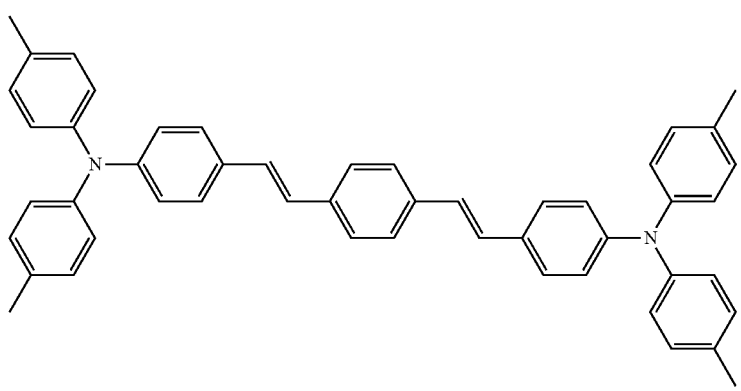
BD6
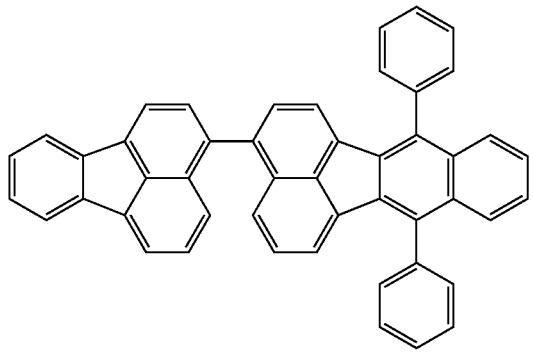
BD7
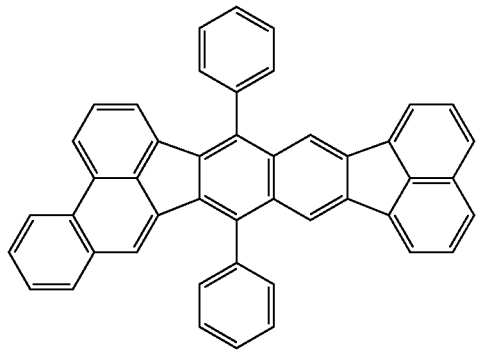
BD8
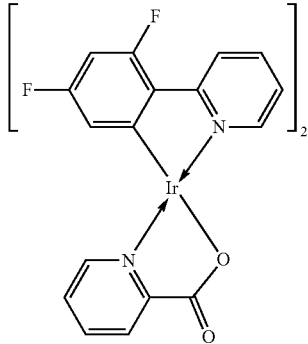
GD1
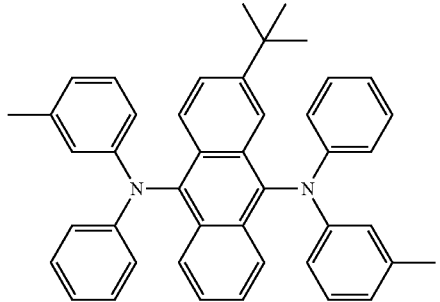

-continued
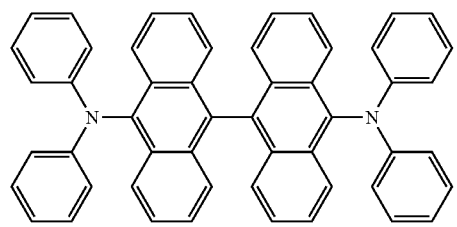
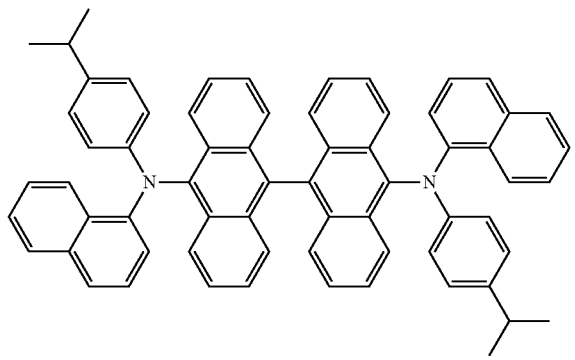
GD2　　　　　　　　　　　　　　GD3
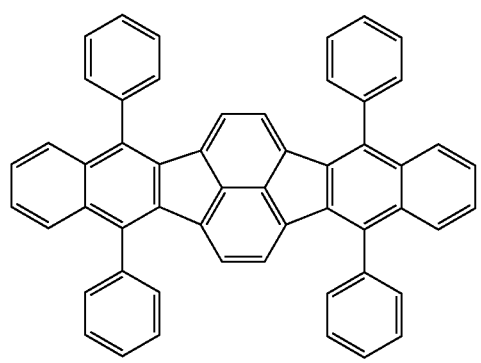
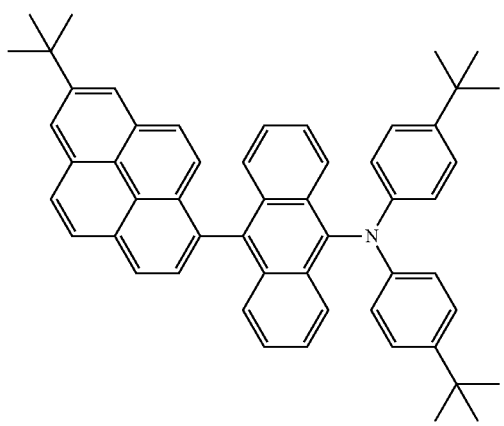
GD4　　　　　　　　　　　　　　GD5
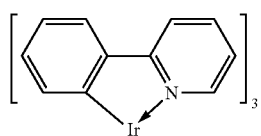
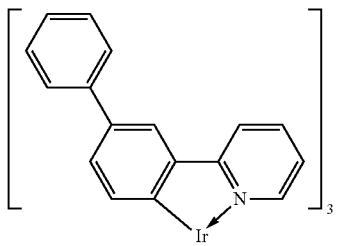
GD6　　　　　　　　　　　　　　GD7
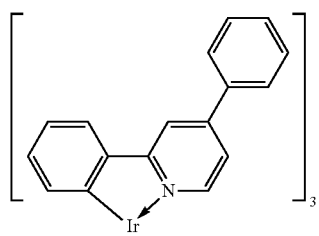
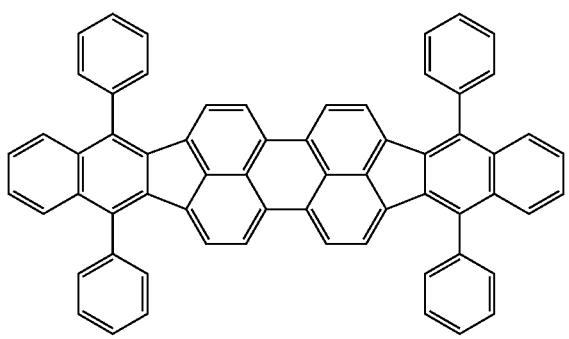
GD8　　　　　　　　　　　　　　RD1

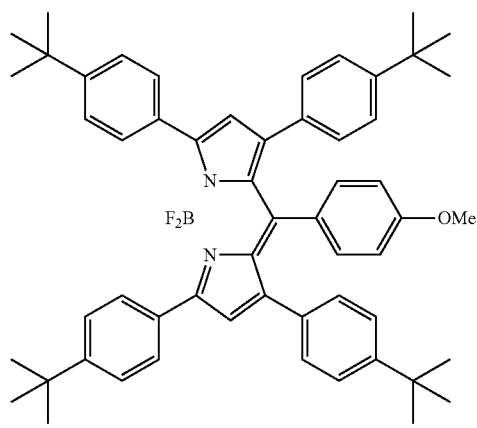
-continued
RD2
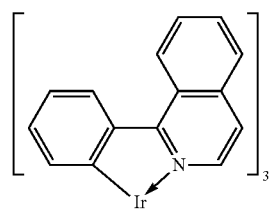
RD3
RD4
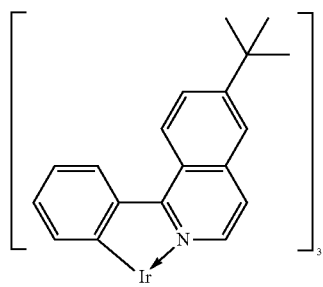
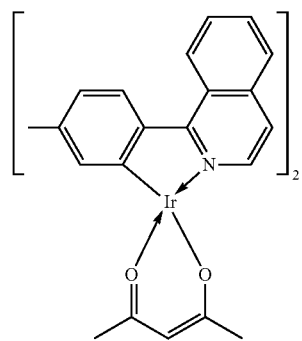
RD5
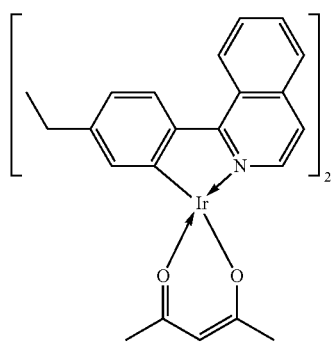
RD6
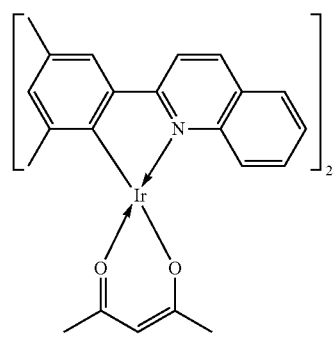
RD7
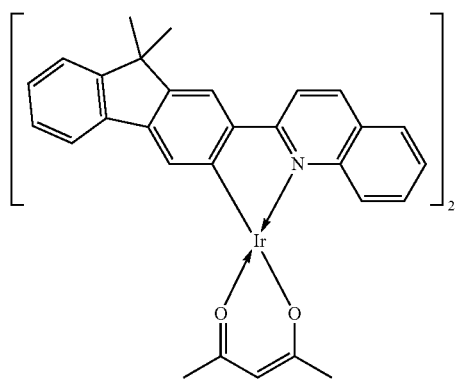
RD8

As the light emitting layer hosts or emitting assist materials contained in a light emitting layer, in addition to aromatic hydrocarbon compounds or derivatives thereof, carbazole derivatives, dibenzofuran derivatives, dibenzothiophene derivatives, organic aluminum complexes such as tris(8-quinolinolate)aluminum, organic beryllium complexes and the like are mentioned.

Specific examples of compounds used as the light emitting layer hosts or emitting assist materials contained in a light emitting layer will be now mentioned, but certainly not limited thereto.

EM1
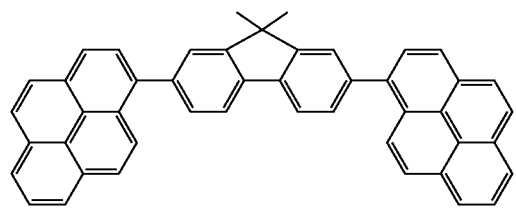

EM2
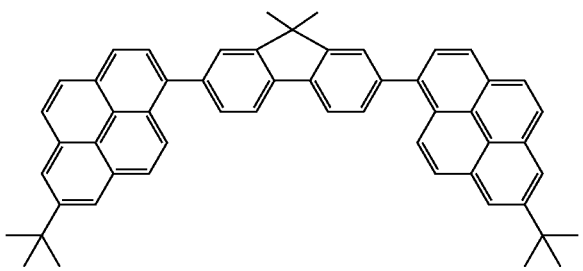

EM3
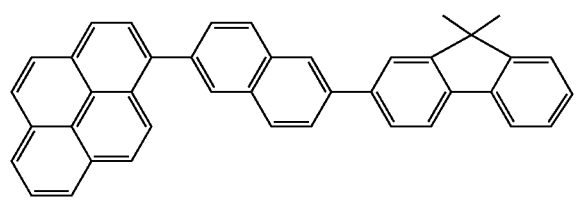

EM4
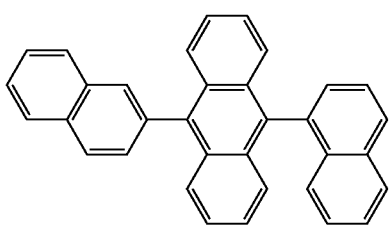

EM5
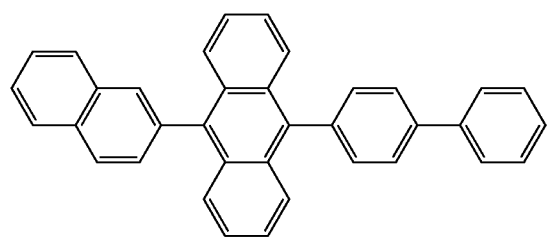

EM6
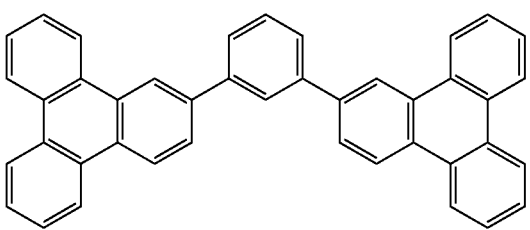

EM7
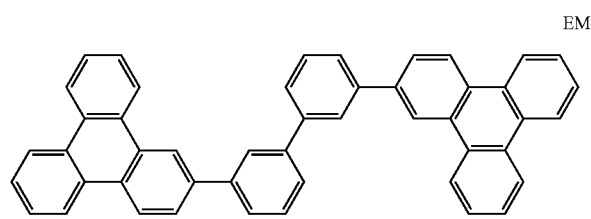

EM8
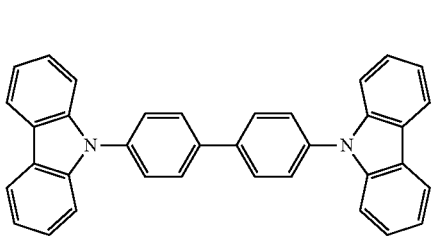

EM9
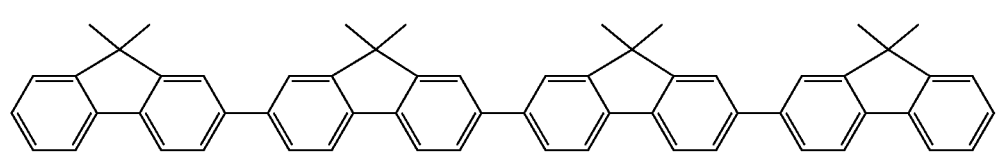

EM10
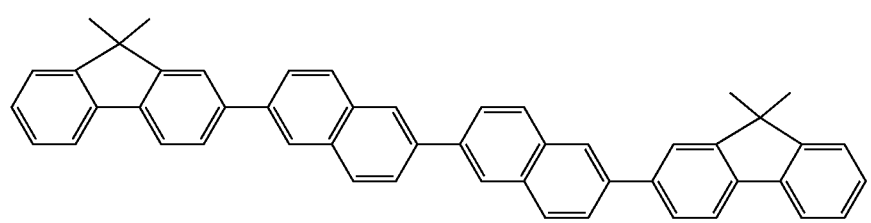

EM11

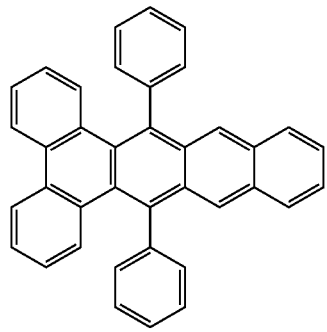

EM12

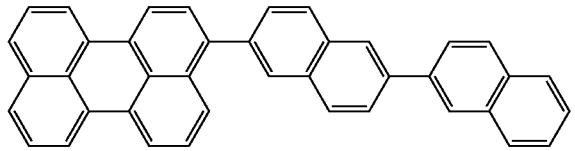

EM13

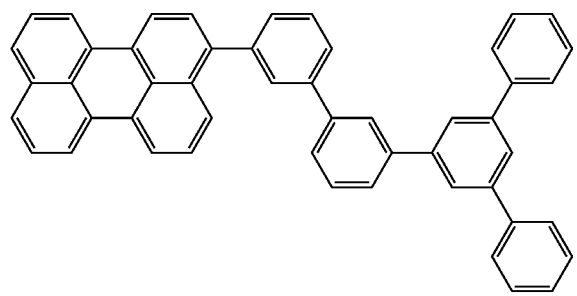

EM14

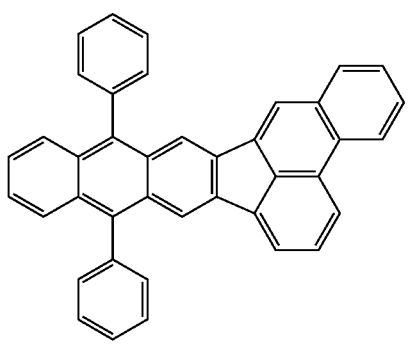

EM15

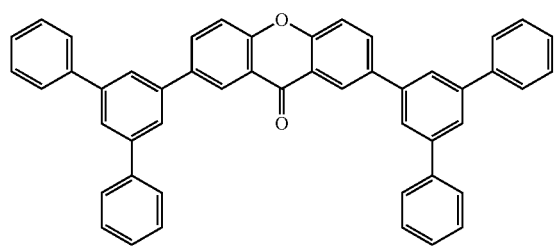

EM16

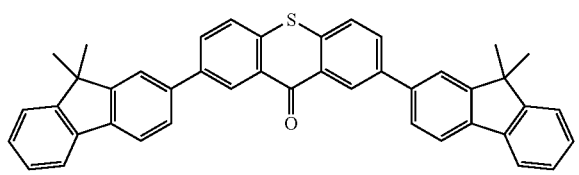

EM17

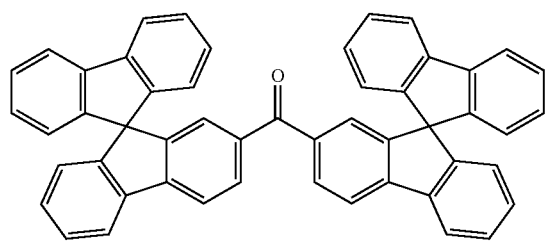

The electron transport material can be optionally selected from those which can transport electrons injected from a cathode to a light emitting layer, and is selected in view of the balance with the hole mobility of hole transport material and the like. As the materials with electron transport properties, oxadiazole derivatives, oxazole derivatives, pyrazine derivatives, triazole derivatives, triazine derivatives, quinoline derivatives, quinoxaline derivatives, phenanthroline derivatives, organic aluminum complexes, fused ring compounds (e.g. fluorene derivatives, naphthalene derivatives, chrysene derivatives, anthracene derivatives etc.) are mentioned. Further, the above-mentioned electron transport materials are also suitably used for a hole blocking layer.

Specific examples of compounds used as electron transport materials will be now mentioned, but certainly not limited thereto.

33 34
ET1 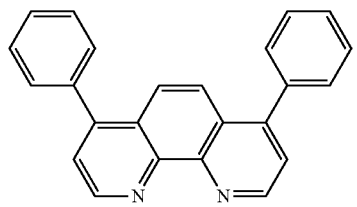 ET2 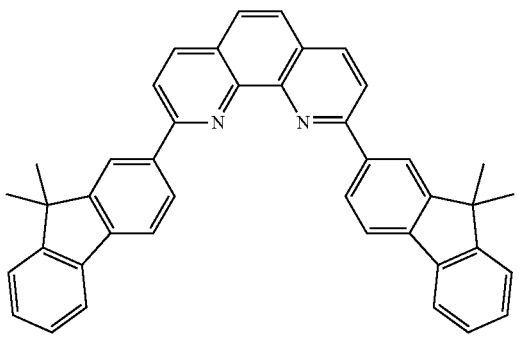
ET3 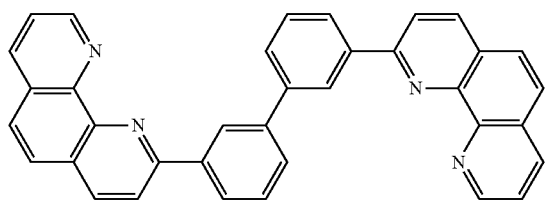 ET4 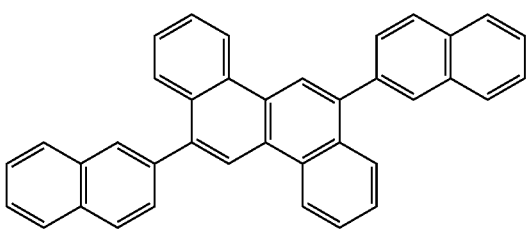
ET5 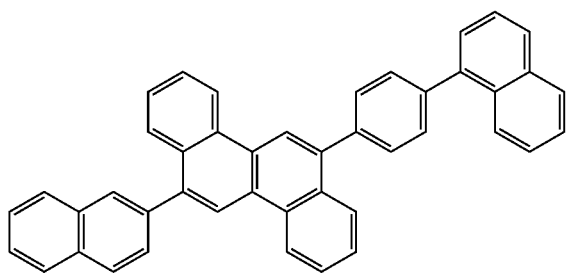 ET6 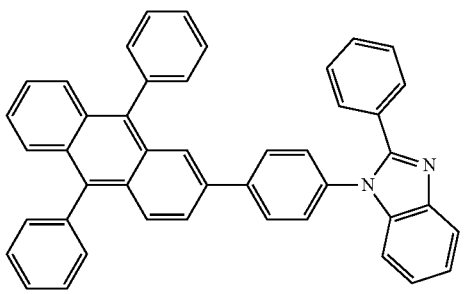
ET7 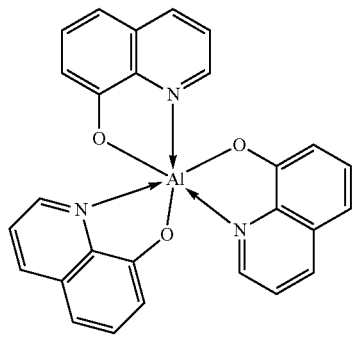 ET8 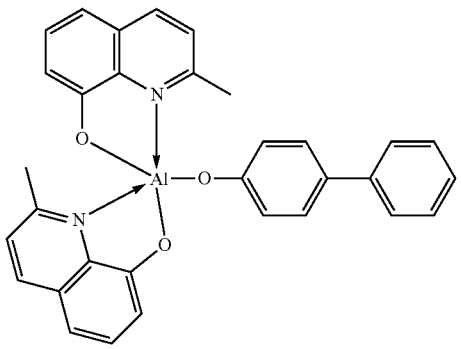
ET9 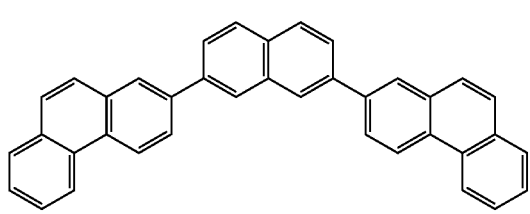 ET10 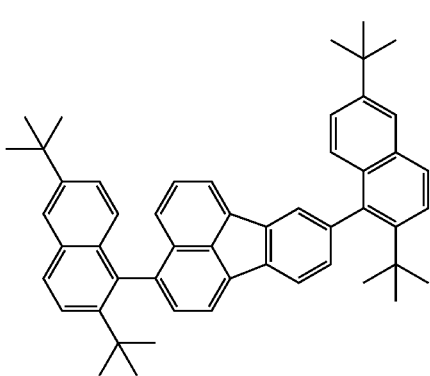

The electron injection material can be optionally selected from those which can easily inject electrons from a cathode, and is selected in view of the balance with hole injection properties and the like. The organic compound according to the present embodiment can be also used by mixing with an electron transport material. That is, in addition to the organic compound according to the present embodiment, a second compound can be contained. As the second compound, anthraquinone derivatives, fluorene derivatives, naphthalene derivatives, indene derivatives, terphenyl derivatives, acenaphthofluoranthene derivatives, indenoperylene derivatives and phenanthroline derivatives are mentioned. The derivatives each may contain a substituent and preferably contains an electron-donating substituent such as a cyano group.

More specifically, the compounds represented by the following structural formulae are mentioned.

EI1

EI2

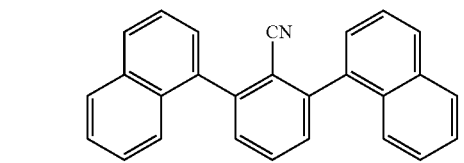

EI3

EI4

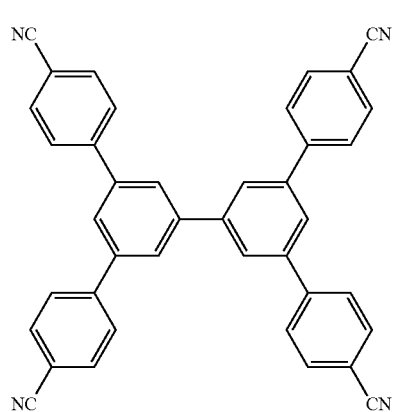

EI5

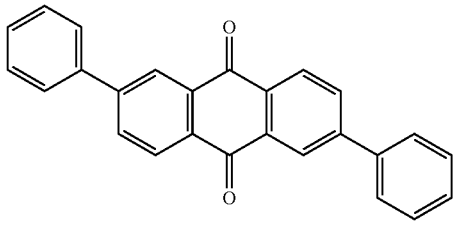

EI6

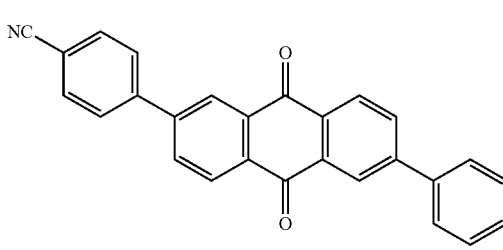

EI7

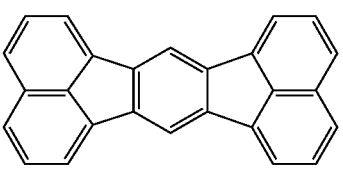

EI8

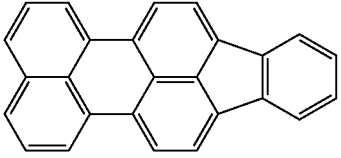

The constituent materials of the anode which the organic light emitting element according to the present invention contains are preferably those which have as high a work function as possible. For example, simple metals such as aurum, platinum, silver, copper, nickel, palladium, cobalt, selenium, vanadium and tungsten, or alloys which these are combined, metal oxides such as tin oxide, zinc oxide, indium oxide, indium tin oxide (ITO) and indium zinc oxide can be used. In addition, conductive polymers such as polyaniline, polypyrrole and polythiophene can be also used.

These electrode substances may be used alone or two or more of the electrode substances may be used in combination. In addition, the anode may be constituted of a layer or may be constituted of a plurality of layers.

On the other hand, the constituent materials of the cathode are preferably those which have a low work function. Examples thereof include alkali metals such as lithium, alkaline earth metals such as calcium, and simple metals such as aluminum, titanium, manganese, silver, lead and chromium. Alternatively, alloys which these simple metals are combined can be also used.

For example, magnesium-silver, aluminum-lithium, aluminum-magnesium and the like can be used. Metal oxides such as indium tin oxide (ITO) can be utilized. These electrode substances may be used alone or two or more of the electrode substances may be used in combination. In addition, the cathode may be constituted of a layer or may be constituted of multi layers.

Organic compound layers (a hole injection layer, a hole transport layer, an electron blocking layer, a light emitting layer, a hole blocking layer, an electron transport layer, an electron injection layer etc.) constituting the organic light emitting element of the present invention are formed by the methods given below.

For the organic compound layers constituting the organic light emitting element of the present invention, dry processes such as a vacuum evaporation method, an ionized evaporation method, sputtering and plasma can be used. In addition, wet processes, that is, after dissolution in a proper solvent, a layer is formed by a known coating method (e.g. spin coating, dipping, a casting method, a LB method, an ink-jet method etc.), can be also used in place of dry processes.

When a layer is formed by a vacuum evaporation method or a solution coating method or the like, crystallization and the like are difficult to occur and temporal stability is excellent. In addition, when a film is formed by a coating method, a film can be also formed by combining a proper binder resin.

As the above-mentioned binder resins, polyvinyl carbazole resin, polycarbonate resin, polyester resin, ABS resin, acrylic resin, polyimide resin, phenol resin, epoxy resin, silicon resin, urea resin and the like are mentioned, but not limited thereto.

In addition, these binder resins may be used alone as a homopolymer or a copolymer or two or more of the binder resins may be used in combination. Further, known additives such as a plasticizer, an antioxidant and a UV absorber may be combined as needed.

Uses of the Organic Light Emitting Element According to the Present Embodiment

The organic light emitting element of the present invention can be used as a constituent member for a display device and a lighting device. Further, there are uses such as an exposure light source of an electrophotographic image forming device, the backlight of a liquid crystal display device, a color filterless white light source and a light emitting device having a color filter and a white light source and the like.

The color filter is a filter into which at least any of, for example, three colors, red, green and blue, penetrates. A light emitting device combining a filter to adjust the chromaticity of a white color and a white light source can be used.

The display device contains the organic light emitting element of the present embodiment in its display unit. This display unit contains a plurality of luminous points. These luminous points contain the organic light emitting element of the present invention and an active element connected to the organic light emitting element. Herein, as the luminous points, a pixel and the like are mentioned.

As an example of active elements, a switching element to control emitted luminance or an amplifying element is mentioned, and more specifically, a transistor is mentioned.

In this organic light emitting element, the anode or the cathode and the drain electrode or source electrode of a transistor are electrically connected. Herein, the display device can be used as an image display device of PC and the like.

The display device contains an input unit to input image information from area CCD, linear CCD, memory cards and the like, and may be an image information processor to display the input image on a display unit.

In addition, in display units which an imaging device and an ink-jet printer contain, both an image output function to display image information input from the outside and an input function to input processing information to an image as an operation panel may be contained. The display device may be also used as a display unit of a multifunction printer.

When the organic light emitting element according to the present embodiment is used for a display unit, a touch panel function can be contained. Touch panel function systems may be a capacitive method, a resistive method or an infrared method.

A lighting device is, for example, a device to illuminate rooms. The lighting device may be a device which emits any of a white color, a neutral white color and further colors from blue to red.

In the present embodiment, the white color has a color temperature of 4200 K and the neutral white color has a color temperature of 5000 K. A lighting device may further contain a color filter. In addition, the CIE coordinates may be used for the definition of white.

The lighting device according to the present embodiment contains the organic light emitting element according to the present embodiment and an AC/DC converter circuit connected thereto and used to supply driving voltage.

The AC/DC converter circuit according to the present embodiment is a circuit to convert from AC voltage to DC voltage.

In addition, the lighting device according to the present embodiment can contain a heat release unit to release heat from a light emitting unit and a circuit to the outside of the device. As the heat release unit, a radiator plate constituted of a metal with high thermal conductivity and liquid silicon are mentioned. As metals with high thermal conductivity, for example, metals having aluminum are mentioned. When heat is released using liquid silicon, heat can be released by convection of liquid silicon.

The image forming device according to the present embodiment is an image forming device containing a photo conductor, an electrification unit to electrify the surface of this photo conductor, an exposure unit to expose the photo conductor, and a developing machine to develop an electrostatic latent image formed on the surface of the photo conductor, wherein the exposure unit contains the organic light emitting element of the present embodiment.

As the exposure unit, for example, an exposure apparatus containing the organic light emitting element according to the present embodiment is mentioned. The organic light emitting elements which the exposure apparatus contains may be arranged in lines or may be a form in which the whole exposure surface of the exposure apparatus emits light.

In addition, as uses other than an organic light emitting element, the organic compound of the present invention can be used for organic solar batteries, organic TFT, fluorescence sensing materials for a living body and the like, films, filters and the like.

The display device using the organic light emitting element of the present embodiment will be now described using FIG. 1.

In the display device 1 in FIG. 1, the glass substrate 11 and the moisture proof film 12 to protect the TFT element or organic compound layers on the upper part thereof are provided. In addition, the sign 13 is the metallic gate electrode 13. The sign 14 is the gate insulating film 14 and 15 is the semiconductor layer.

The TFT element 18 contains the semiconductor layer 15, the drain electrode 16 and the source electrode 17. The insulating film 19 is provided on the upper part of the TFT element 18. The anode 21 and the source electrode 17 constituting the organic light emitting element are connected via the contact holes 20.

It is noted that the system of electrical connection between the electrodes (anode and cathode) contained in the organic light emitting element, and the electrodes (source electrode and drain electrode) contained in TFT is not limited to the mode shown in FIG. 1. That is, either the anode or the cathode and either the source electrode or the drain electrode of the TFT element only need to be electrically connected.

In the display device 1 in FIG. 1, the organic compound layers are shown like a layer, but the organic compound layer 22 may be the multilayer form. A first protection layer 24 and a second protection layer 25 to inhibit the deterioration of the organic light emitting element are provided on the top side of the cathode 23.

In the display device 1 in FIG. 1, a transistor is used as a switching element, but in place of this, a MIM element may be used as a switching element.

The transistor used in the display device 1 in FIG. 1 is not limited to a transistor using a single crystal silicon wafer and may be a thin film transistor having an active layer on the insulating surface of a substrate. As the active layer, single crystal silicon, amorphous silicon, non-single crystal silicon such as microcrystalline silicon, non-single crystal oxide semiconductors such as indium zinc oxide and indium gallium zinc oxide, a transparent oxide semiconductor are mentioned. It is noted that a thin film transistor is also referred to as a TFT element.

The transistor contained in the display device 1 in FIG. 1 may be formed within a substrate such as a Si substrate. The formation within a substrate means that a transistor is produced by processing a substrate such as a Si substrate itself. That is, having a transistor within a substrate can be also considered that the substrate and the transistor are formed together.

Whether or not a transistor is provided within a substrate is selected depending on resolution. In the case of a 1 inch QVGA resolution, for example, it is preferred that a transistor be provided within a Si substrate.

The organic light emitting device according to the present invention may contain a switching element to control the light emission of the organic light emitting element. The switching element connected to the organic light emitting element may contain an oxide semiconductor in the channel unit thereof. The oxide semiconductor may be amorphous or a crystal or a state in which both exists.

The crystal may be a single crystal, a microcrystal, or a crystal in which a specific axis such as the C axis is oriented, or a mixture of at least two of them.

The organic light emitting device containing such switching element may be used as an image display device in which each organic light emitting element is provided as a pixel, or may be used as a lighting device, and also may be used as an exposure light source to expose a photo conductor of an electrophotographic image forming device such as a laser beam printer or a copying machine.

Figure 2:
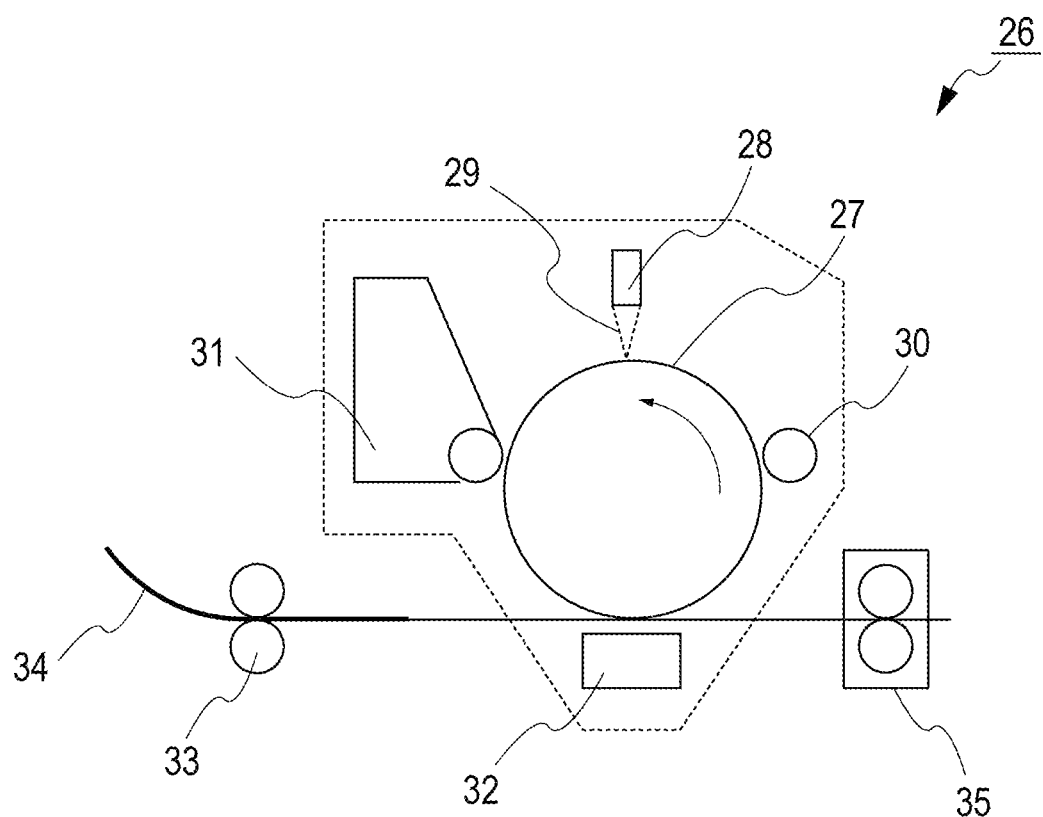
FIG. 2 is a schematic diagram of an image forming device containing the organic light emitting element according to the present invention.

FIG. 2 is a schematic diagram of an image forming device 26 according to the present invention. The image forming device contains a photo conductor, an exposure light source, a developing machine, an electrification unit, a transcriber, a supply roller and a fuser.

The light 29 is emitted from the exposure light source 28 and an electrostatic latent image is formed on the surface of photo conductor 27. This exposure light source contains the organic light emitting element according to the present invention. The developing machine 30 contains a toner and the like. The electrification unit 31 electrifies the photo conductor. The transcriber 32 copies the developed image into a recording medium. The supply roller 33 supplies the recording medium. The recording medium 34 is for example paper. The fuser 35 fixes the formed image on the recording medium.

Figure 3:
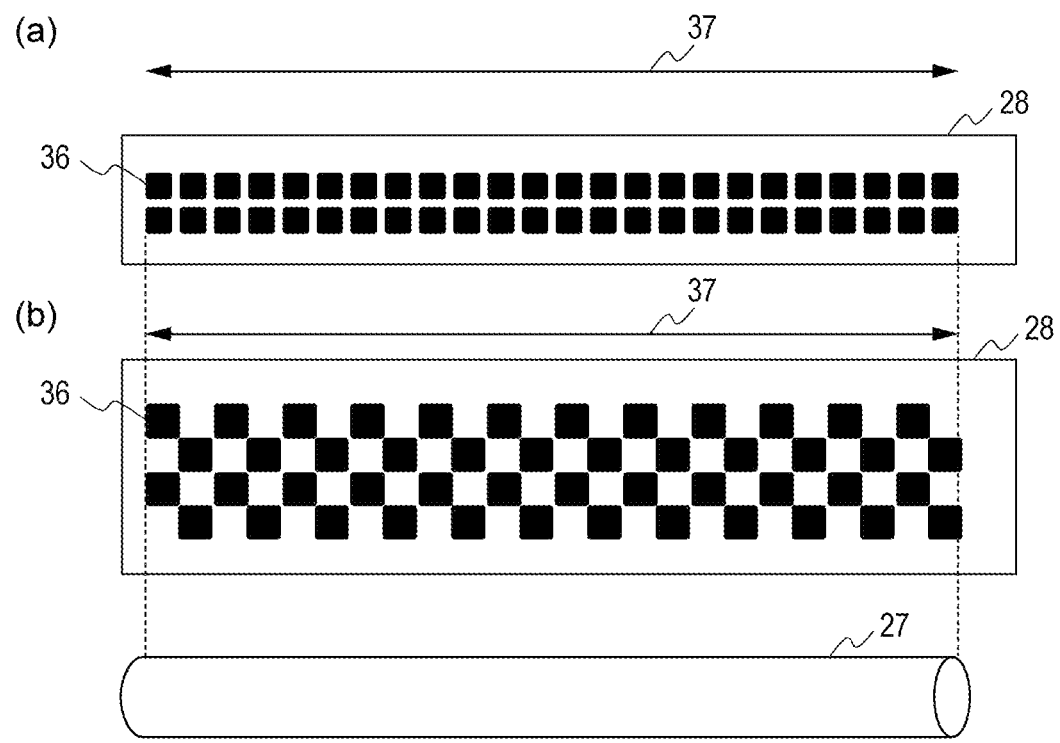
FIG. 3 is a schematic diagram of an exposure apparatus containing the organic light emitting element involved in the present invention.

FIG. 3(a) and FIG. 3(b) are schematic diagrams showing the state in which a plurality of light emitting units 36 is arranged on the exposure light source 28 on a long substrate. The arrow 37 shows the line direction in which organic light emitting elements are arranged. This line direction is the same as the direction of an axis on which the photo conductor 27 rotates.

FIG. 3(a) is the form in which light emitting units are arranged along the axis direction of the photo conductor. FIG. 3(b) is the form in which light emitting units are alternately arranged in the line direction in each of the first line and the second line. In the first line and the second line, the units are arranged in different places in the row direction.

In the first line, a plurality of light emitting units is arranged at intervals. The second line contains light emitting units in the places corresponding to the intervals of light emitting units in the first line. That is, a plurality of light emitting units is arranged at intervals in the row direction.

In other words, the arrangement in FIG. 3(b) can be referred to as, for example, the state of lattice arrangement, the state of zigzag lattice arrangement, or a checked pattern.

Figure 4:
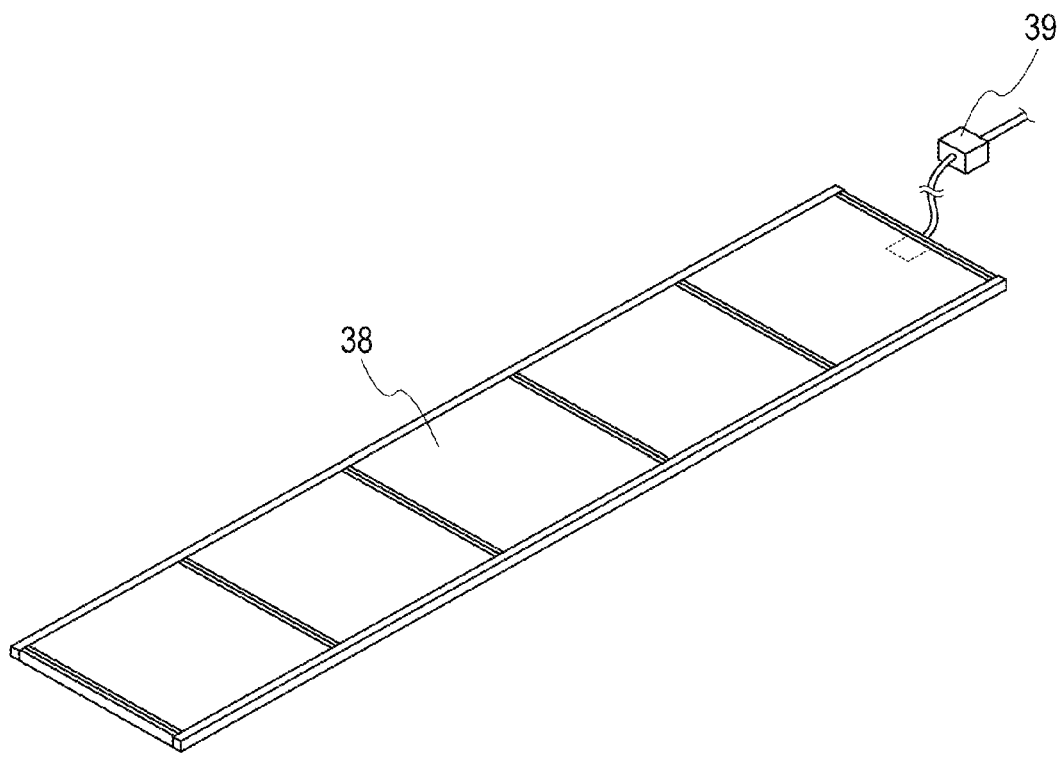
FIG. 4 is a schematic diagram of a lighting device containing the organic light emitting element according to the present invention.

FIG. 4 is a schematic diagram of the lighting device according to the present invention. The lighting device contains a substrate, the organic light emitting elements 38 and the AC/DC converter circuit 39. In addition, for example, a radiator plate, which is not shown, can be contained in the back side of a substrate surface on the side on which the organic light emitting elements are put.

As described above, by driving a display device using the organic light emitting element of the present invention, a display which has an excellent image quality and is stable for a long period of time can be obtained at low driving voltage.

EXEMPLARY EMBODIMENTS

Exemplary Embodiments 1 to 2, Comparative Examples 1 to 4

In the present exemplary embodiments, organic light emitting elements in which an anode, a hole transport layer, an electron blocking layer, a light emitting layer, a hole/exciton blocking layer, an electron transport layer and a cathode were sequentially formed on a substrate were produced.

First, an ITO film was formed on a glass substrate, and an ITO electrode (anode) was formed by carrying out desired patterning processing. At this time, the film thickness of the ITO electrode was 100 nm. As described above, the substrate in which the ITO electrode was formed was used as an ITO substrate in the following step.

The organic compound layers and electrode layer shown in Table 2 given below were continuously formed on the above-mentioned ITO substrate. It is noted that at this time, the electrodes facing each other (metal electrode layer, cathode) were formed so that the electrode area thereof would be 3 mm$^2$.

TABLE 2

| | MATERIAL | FILM THICKNESS (nm) |
|---|---|---|
| HOLE TRANSPORT LAYER | G-1 | 30 |
| ELECTRON BLOCKING LAYER | G-2 | 10 |
| LIGHT EMITTING LAYER | G-3 (HOST) G-4 (GUEST) (G-3:G-4 = 98:2 (WEIGHT RATIO)) | 30 |
| HOLE BLOCKING LAYER | G-5 | 10 |
| ELECTRON TRANSPORT LAYER | G-6 | 15 |
| ELECTRON INJECTION LAYER, | G-7 G-8 (G-7:G-8 = 50:50 (WEIGHT RATIO)) | 15 |
| METAL ELECTRODE LAYER | A1 | 100 |

Before the metal electrode layer was formed, an element was immersed in water for 10 minutes, followed by vacuum drying at 120° C., and the metal electrode layer was then formed.

As G1 to G7, the compounds shown in Table 3 given below were used. For G8, the 1,1',3,3a,3',3'a,4,4',5,5',6,6',7,7a,7',7'a-hexadecahydro-2,2'-bibenzo[d]imidazolidene compounds used in the present invention and comparative compounds (1) to (4) were used and the evaluation was made. It is noted that the compound names such as HT1 correspond to the compounds described in the present embodiment and A1 and the like showing the compounds of G8 correspond to the names of exemplified compounds.

TABLE 3

| | G1 | G2 | G3 | G4 | G5 | G6 | G7 | G8 | LIGHT EMITTING STATE |
|---|---|---|---|---|---|---|---|---|---|
| EXEMPLARY EMBODIMENT 1 | HT1 | HT7 | EM1 | BD7 | ET2 | ET2 | ET2 | A1 | ○ |
| EXEMPLARY EMBODIMENT 2 | HT1 | HT7 | EM1 | BD7 | ET2 | ET2 | ET2 | B4 | ○ |
| COMPARATIVE EXAMPLE 1 | HT1 | HT7 | EM1 | BD7 | ET2 | ET2 | ET2 | COMPARATIVE COMPOUND 1 | X |
| COMPARATIVE EXAMPLE 2 | HT1 | HT7 | EM1 | BD7 | ET2 | ET2 | ET2 | COMPARATIVE COMPOUND 2 | X |
| COMPARATIVE EXAMPLE 3 | HT1 | HT7 | EM1 | BD7 | ET2 | ET2 | ET2 | COMPARATIVE COMPOUND 3 | X |
| COMPARATIVE EXAMPLE 4 | HT1 | HT7 | EM1 | BD7 | ET2 | ET2 | ET2 | COMPARATIVE COMPOUND 4 | X |

Consequently, when light emission was observed by applying a voltage of 8 V, light emission could be observed about the organic compounds according to the present embodiment, but light emission could not be observed about the comparative compounds (1) to (4).

It is believed that this is caused by losing electron injection properties due to the outflow or deterioration of the comparative compounds during immersion into water. That is, stable organic light emitting elements could not be obtained using comparative compounds.

Exemplary Embodiments 3 to 10

Organic light emitting elements in which an anode, a hole transport layer, an electron blocking layer, a light emitting layer, a hole blocking layer, an electron transport layer, an electron injection layer and a metal electrode layer (cathode) were sequentially formed on a substrate were produced.

First, an ITO film was formed on a glass substrate, and an ITO electrode (anode) was formed by carrying out desired patterning processing. At this time, the film thickness of the ITO electrode was 100 nm. As described above, the substrate in which the ITO electrode was formed was used as an ITO substrate in the following step.

The organic compound layers and electrode layer were formed on the above-mentioned ITO substrate as shown in Table 4 given below. It is noted that at this time, the electrodes facing each other (metal electrode layer, cathode) were formed so that the electrode area thereof would be 3 mm$^2$.

TABLE 4

| | MATERIAL | FILM THICKNESS (nm) |
|---|---|---|
| HOLE TRANSPORT LAYER | G-1 | 30 |
| ELECTRON BLOCKING LAYER | G-2 | 10 |
| LIGHT EMITTING LAYER | G-3 (HOST) G-4 (GUEST) (G-3:G-4 = 98:2 (WEIGHT RATIO)) | 30 |
| HOLE BLOCKING LAYER | G-5 | 10 |
| ELECTRON TRANSPORT LAYER | G-6 | 15 |
| ELECTRON INJECTION LAYER, | G-7 G-8 (G-7:G-8 = 50:50 (WEIGHT RATIO)) | 15 |

TABLE 4-continued

| | MATERIAL | FILM THICKNESS (nm) |
|---|---|---|
| METAL ELECTRODE LAYER | A1 | 100 |

As G1 to G7, the compounds shown in Table 5 given below were used. For G8, 1,1',3,3a,3',3'a,4,4',5,5',6,6',7,7a,7',7'a-hexadecahydro-2,2'-bibenzo[d]imidazolidene compounds according to the present embodiment were used and the evaluation was made.

TABLE 5

| | G1 | G2 | G3 | G4 | G5 | G6 | G7 | G8 | LIGHT EMISSION EFFICIENCY (cd/A) | VOLTAGE (V) |
|---|---|---|---|---|---|---|---|---|---|---|
| EXEMPLARY EMBODIMENT 3 | HT2 | HT7 | EM1 | BD1 | ET2 | ET2 | ET3 | A1 | 3 | 6 |
| EXEMPLARY EMBODIMENT 4 | HT2 | HT9 | EM3 | BD6 | ET5 | ET2 | ET1 | A1 | 3 | 6 |
| COMPARATIVE EXAMPLE 5 | HT4 | HT4 | EM7 | GD7 | ET4 | ET3 | ET3 | A4 | 15 | 6 |
| COMPARATIVE EXAMPLE 6 | HT6 | HT8 | EM9 | RD4 | ET10 | ET3 | ET2 | A12 | 7 | 7 |
| COMPARATIVE EXAMPLE 7 | HT6 | HT8 | EM12 | RD1 | ET9 | ET2 | ET4 | A16 | 3 | 6 |
| COMPARATIVE EXAMPLE 8 | HT2 | HT9 | EM13 | RD2 | ET4 | ET3 | ET3 | B1 | 4 | 7 |
| COMPARATIVE EXAMPLE 9 | HT1 | HT9 | EM5 | GD4 | ET2 | ET3 | ET2 | B2 | 5 | 6 |
| COMPARATIVE EXAMPLE 10 | HT1 | HT7 | EM4 | BD7 | ET10 | ET3 | ET2 | B6 | 3 | 6 |

Exemplary Embodiments 11 to 12

Organic light emitting elements in which an anode, a hole transport layer, an electron blocking layer, a light emitting layer, a hole blocking layer, an electron transport layer, an electron injection layer and a metal electrode layer (cathode) were sequentially formed on a substrate were produced.

First, an ITO film was formed on a glass substrate, and an ITO electrode (anode) was formed by carrying out desired patterning processing. At this time, the film thickness of the ITO electrode was 100 nm. As described above, the substrate in which the ITO electrode was formed was used as an ITO substrate in the following step.

The organic compound layers and electrode layer shown in Table 6 given below were formed on the above-mentioned ITO substrate. It is noted that at this time, the electrodes facing each other (metal electrode layer, cathode) were formed so that the electrode area thereof would be 3 mm$^2$.

TABLE 6

| | MATERIAL | FILM THICKNESS (nm) |
|---|---|---|
| HOLE TRANSPORT LAYER | G-1 | 30 |
| ELECTRON BLOCKING LAYER | G-2 | 10 |
| LIGHT EMITTING LAYER | G-3 (HOST) | 30 |
| | G-4 (GUEST) | |
| | (G-3:G-4 = 98:2 (WEIGHT RATIO)) | |
| HOLE BLOCKING LAYER | G-5 | 10 |
| ELECTRON TRANSPORT LAYER | G-6 | 25 |
| ELECTRON INJECTION LAYER, | G-8 | 5 |
| METAL ELECTRODE LAYER | Al | 100 |

As G1 to G7, the compounds shown in Table 7 given below were used. For G8, 1,1',3,3a,3',3'a,4,4',5,5',6,6',7,7a,7',7'a-hexadecahydro-2,2'-bibenzo[d]imidazolidene compounds according to the present embodiment were used and the evaluation was made.

TABLE 7

| | G1 | G2 | G3 | G4 | G5 | G6 | G8 | LIGHT EMISSION EFFICIENCY (cd/A) | VOLTAGE (V) |
|---|---|---|---|---|---|---|---|---|---|
| EXEMPLARY EMBODIMENT 11 | HT2 | HT7 | EM1 | BD1 | ET2 | ET2 | A1 | 3 | 9 |
| EXEMPLARY EMBODIMENT 12 | HT2 | HT9 | EM3 | BD6 | ET5 | ET4 | A3 | 3 | 9 |

As described above using exemplary embodiments, by using an organic compound containing the 1,1',3,3a,3',3'a, 4,4',5,5',6,6',7,7a,7',7'a-hexadecahydro-2,2'-bibenzo[d]imidazolidene skeleton according to the present embodiment for an electron injection layer of a light emitting element, an element with stability to water can be produced. Thus, a stable and long-life element can be obtained.

As described above, by using a compound containing the 1,1',3,3a,3',3'a,4,4',5,5',6,6',7,7a,7',7'a-hexadecahydro-2,2'-bibenzo[d]imidazolidene skeleton for an electron injection layer, the organic light emitting element according to the present invention is stable to water and humidity. Thus, an organic light emitting element which has high light emission efficiency and excellent long-life characteristics can be provided.

According to the present invention, a stable organic light emitting element with excellent water resistance can be provided by containing a 1,1',3,3a,3',3'a,4,4',5,5',6,6',7,7a,7', 7'a-hexadecahydro-2,2'-bibenzo[d]imidazolidene compound in an electron injection layer of an organic light emitting element.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-253637, filed Dec. 6, 2013, which is hereby incorporated by reference herein in its entirety.

What is claimed is:

1. An organic light emitting element containing an anode and a cathode, and a light emitting layer arranged between the anode and the cathode, and
the organic light emitting element further containing an organic compound layer which is arranged between the cathode and the light emitting layer and touches the cathode,
wherein the organic compound layer contains a 1,1',3,3a, 3',3'a,4,4',5,5',6,6',7,7a,7',7'a-hexadecahydro-2,2'-bibenzo[d]imidazolidene compound represented by the following general formula [1]:

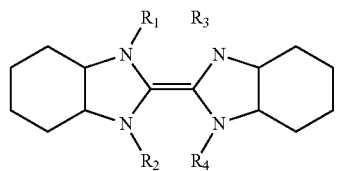

[1]

in the formula [1], $R_1$ to $R_4$ are each independently selected from the group consisting of a substituted or unsubstituted phenyl group, a substituted or unsubstituted biphenyl group, a substituted or unsubstituted naphthyl group, a substituted or unsubstituted phenanthrenyl group, a substituted or unsubstituted fluorenyl group, a substituted or unsubstituted triphenylenyl group, a substituted or unsubstituted dibenzofuranyl group, and a substituted or unsubstituted dibenzothiophene group.

2. The organic light emitting element according to claim 1, wherein, in the general formula [1], the $R_1$ to $R_4$ are each independently selected from the group consisting of the phenyl group, the biphenyl group, the naphthyl group, the phenanthrenyl group, the fluorenyl group, and the triphenylenyl group.

3. The organic light emitting element according to claim 1, wherein the organic compound layer contains a second compound which is of a different type from a compound represented by the general formula [1].

4. The organic light emitting element according to claim 3, wherein the second compound is a compound with higher oxidation potential than that of a compound represented by the general formula [1].

5. The organic light emitting element according to claim 3, wherein the second compound is selected from the group consisting of an anthraquinone derivative, a fluorene derivative, a naphthalene derivative, an indene derivative, a terphenyl derivative, an acenaphthofluoranthene derivative, an indenoperylene derivative and a phenanthroline derivative.

6. The organic light emitting element according to claim 3, wherein, when the sum total of the weight of the compound represented by the general formula [1] and the weight of the second compound is 100 wt %, the weight of the second compound is 0.1 wt % or more and 80 wt % or less.

7. The organic light emitting element according to claim 6, wherein the mixing ratio of the organic compound represented by the general formula [1] and the second compound is 50:50.

8. The organic light emitting element according to claim 1,
wherein the light emitting layer contains a plurality of types of light emitting materials,
wherein at least one of the plurality of types of light emitting materials is a light emitting material emitting color light different from that of other light emitting materials,
wherein the light emitting layer is a light emitting layer emitting white light by mixing light emitted from the plurality of types of light emitting materials.

9. The organic light emitting element according to claim 1,
further containing a second light emitting layer emitting color light different from that of the light emitting layer,
wherein the element emits white light by mixing light emitted from the light emitting layer and light emitted from the second light emitting layer.

10. The organic light emitting element according to claim 1, further containing a color filter.

11. A display device containing a plurality of luminous points,
wherein at least one of the plurality of luminous points contains the organic light emitting element according to claim 1 and an active element connected to the organic light emitting element.

12. The display device according to claim 11, wherein the active element is a transistor,
wherein an active region of the transistor contains a transparent oxide semiconductor.

13. An image information processor containing a display unit to display images, and
an input unit to input image information,
wherein the display unit is the display device according to claim 11.

14. A lighting device containing the organic light emitting element according to claim 1, and
an AC/DC converter circuit connected to the organic light emitting element.

15. A lighting device containing the organic light emitting element according to claim 1, and a heat release unit to release heat in the device to the outside of the device.

16. A lighting device containing the organic light emitting element according to claim 1, and a switching element connected to the organic light emitting element,
- wherein the switching element is a transistor,
- wherein the transistor contains an oxide semiconductor in a channel unit thereof.

17. An image forming device containing:
- a photo conductor;
- an electrification unit which electrifies a surface of the photo conductor;
- an exposure unit which exposes the photo conductor to form an electrostatic latent image; and
- a developing machine which develops the electrostatic latent image formed on the surface of the photo conductor, and
- wherein the exposure unit contains the organic light emitting element according to claim 1.

18. The image forming device according to claim 17, wherein the exposure unit further contains a switching element connected to the organic light emitting element,
- wherein the switching element contains an oxide semiconductor in a channel unit.

19. An exposure device which exposes a photo conductor,
- wherein the exposure device contains a plurality of the organic light emitting element according to claim 1,
- wherein the plurality of the organic light emitting elements is arranged in lines.

* * * * *